(12) United States Patent
Lee et al.

(10) Patent No.: US 8,361,551 B2
(45) Date of Patent: Jan. 29, 2013

(54) METHODS FORMING HIGH DIELECTRIC TARGET LAYER

(75) Inventors: Jong-Cheol Lee, Seoul (KR); Ki-Yeon Park, Seoul (KR); Jun-Noh Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 423 days.

(21) Appl. No.: 12/648,377

(22) Filed: Dec. 29, 2009

(65) Prior Publication Data
US 2010/0167554 A1 Jul. 1, 2010

(30) Foreign Application Priority Data
Dec. 30, 2008 (KR) ........................ 10-2008-0136505

(51) Int. Cl.
C23C 16/40 (2006.01)
(52) U.S. Cl. .............. 427/255.31; 427/255.394; 117/89; 117/91
(58) Field of Classification Search ............. 427/255.31, 427/255.394; 117/84, 89, 91
See application file for complete search history.

(56) References Cited

U.S. PATENT DOCUMENTS

| | | | |
|---|---|---|---|
| 2002/0068466 A1* | 6/2002 | Lee et al. ...................... | 438/765 |
| 2003/0129117 A1* | 7/2003 | Mills ........................... | 423/347 |
| 2004/0009679 A1* | 1/2004 | Yeo et al. ..................... | 438/785 |
| 2004/0203254 A1* | 10/2004 | Conley et al. ................. | 438/778 |
| 2004/0237893 A1* | 12/2004 | Park et al. ..................... | 118/715 |
| 2005/0277223 A1* | 12/2005 | Lee et al. ...................... | 438/100 |
| 2007/0287300 A1* | 12/2007 | Rueger et al. ................. | 438/778 |
| 2008/0213940 A1* | 9/2008 | Lee et al. ..................... | 438/104 |

FOREIGN PATENT DOCUMENTS

| | | |
|---|---|---|
| JP | 2007266464 A | 10/2007 |
| KR | 100444304 B1 | 8/2004 |
| KR | 1020050037253 A | 4/2005 |
| KR | 1020050067529 A | 7/2005 |

OTHER PUBLICATIONS

Hackley, Justin C., et al., "Interface of atomic layer deposited HfO2 films on GaAs (100) surfaces". Applied Physics Letters 92, 162902 (2008), pp. 1-3.*
Lemonds, A.M., et al., "Surface science investigations of atomic layer deposition half-reactions using TaF5 and Si2H6". Surface Science 538 (2003) 191-203.*
Jachimowski, T.A., et al., "Direct reaction of gas-phase atomic hydrogen with chemisorbed hydrogen on Ru(001)". J. Chem Phys. 101 (12), Dec. 15, 1994, pp. 10997-11003.*
Park, Jongkeun, et al., "Reaction between Gas-phase Hydrogen Atom and Chemisorbed Bromine Atoms on a Silicon(001)-(2×1) Surface". Bull. Korean Chem. Soc. 2007, vol. 28, No. 12, pp. 2271-2278.*

* cited by examiner

*Primary Examiner* — Bret Chen
(74) *Attorney, Agent, or Firm* — Volentine & Whitt, PLLC

(57) ABSTRACT

In a method of forming a target layer having a uniform composition of constituent materials, a first precursor including a first central atom and a ligand is chemisorbed on a first reaction site of an object. The ligand or the first central atom is then removed to form a second reaction site. A second precursor including a second central atom is then chemisorbed on the second reaction site.

19 Claims, 16 Drawing Sheets

METHODS FORMING HIGH DIELECTRIC TARGET LAYER

STATEMENT OF RELATED APPLICATION

This application claims priority under 35 U.S.C. §119 to Korean Patent Application No. 10-2008-0136505 filed on Dec. 30, 2008, the disclosure of which is hereby incorporated by reference herein in its entirety.

BACKGROUND

The inventive concept is related to methods of forming a material layer during the fabrication of a semiconductor device. More particularly, the inventive concept relates to methods of forming a composition layer having a uniform composition ratio of constituent materials across the thickness of the layer.

The development of contemporary semiconductor devices is one characterized by ever higher degress of integration density and ever increasing operating speeds. These coincident demands for greater integration and operating speed create great pressure to improve the fabrication technologies enabling manufacture of semiconductor devices.

For example, as semiconductor devices become more highly integrated, the size of cell regions within the semiconductor devices are reduced. Accordingly, it has become increasingly difficult to form a capacitor providing sufficient capacitance for reliable operation of the semiconductor device. The capacitance "C" of the capacitor is directly proportional to the dielectric constant "∈" of its dielectric layer and the capacitive surface area "A" of its electrodes. The capacitance "C" of the capacitor is also inversely proportional to the distance "d" separating the electrodes. Thus the capacitance "C" of the capacitor may be expressed by the equation:
$C = \in A/d$ For capacitors formed using a conventional dielectric material such as silicon oxide or silicon nitride, methods of forming cylindrical-shaped or fin-type lower electrodes have been developed to increase the effective area A of the capacitor, thereby increasing the capacitance C. However, the fabrication of highly complex electrode geometries is difficult and costly.

Accordingly, certain dielectric layers within semiconductor devices, such as gate insulation layers, capacitor dielectric layers, etc., are now formed using materials having a significantly higher dielectric constant than those provided by silicon oxide and silicon nitride. In one example, contemporary dielectric layers include those formed from a plurality of metal oxides, such as hafnium silicate, zirconium silicate, strontium titanium oxide, etc. This type of layer exhibits a much higher dielectric constant than silicon oxide or silicon oxynitride.

A dielectric layer formed from a plurality of metal oxides may be formed using conventionally understood chemical vapor deposition (CVD) process(es) and/or atomic layer deposition (ALD) process(es).

When a dielectric layer is formed using a CVD process or ALD process, a plurality of preliminary layers are typically formed and then heat treated to form the desired dielectric layer. Unfortunately, this approach to the formation of a dielectric layer yields a layer having a lower portion with a substantially different composition ratio than an upper portion. In other words, the thickness of the dielectric layer exhibits a non-uniform composition ratio.

Additionally, when a plurality of precursors are used in the formation of a dielectric layer, the composition ratio of constituent materials forming the layer is a function of the flow rate of the precursors. Thus, if the flow rate for a particular precursor is less than about 10% of the total flow rate of for all of the precursors, the resulting dielectric layer may include greater than about 10%, by atomic composition, of the precursor's primary elemental component (or "central atom").

SUMMARY

Embodiments of the inventive concept provide methods of forming a material layer, such as a dielectric layer, having a uniform composition ratio of constituent materials, as examined across its thickness.

According to an embodiment of the inventive concept, there is provided a method of forming a target layer. In the method, first precursor including a first central atom and a ligand associated with the first central atom is chemisorbed on a first reaction site of an object. The first central atom and/or the first ligand are removed from the first precursor to form a second reaction site. The second precursor including a second central atom is chemisorbed on the second reaction site.

In certain embodiments, the second reaction site may be formed by performing a heat treatment on the object at a temperature ranging between about 200 to 400° C.

In certain embodiments, the second reaction site may be formed by performing a plasma treatment at the object. The plasma may be generated from an inactive gas.

In certain embodiments, a compound including an oxygen atom or a nitrogen atom may be introduced to be reacted with the first precursor and/or the second precursor.

In certain embodiments, the first reaction site may include an oxygen atom.

In certain embodiments, the first reaction site may be formed by treating the object with a compound including an oxygen atom.

In certain embodiments, the second reaction site may be substantially the same as the first reaction site.

In certain embodiments, the second reaction site may include the first central atom.

In certain embodiments, the first central atom may be substantially different from the second central atom.

In certain embodiments, the first central atom may include zirconium, hafnium, strontium, silicon or titanium. These may be used alone or in a combination thereof.

According to another embodiment of the inventive concept, there is provided a method of forming a target layer. In the method, a first precursor including a first central atom is chemisorbed on a first portion of a reaction site in an object. A second precursor is chemisorbed on a second portion of the reaction site in the object. The second portion of the reaction site is substantially different from the first portion of the reaction site.

In certain embodiments, the first precursor may be introduced to the object at a flow rate ranging between about 50 to 1,000 sccm for about 3 to 30 seconds.

In certain embodiments, the reaction site includes an oxygen atom.

According another embodiment of the inventive concept, there is provided a method of forming a target layer. In the method, a first reaction site is partially transformed into a second reaction site. A first precursor including a first central atom is chemisorbed on the first reaction site. A second precursor is chemisorbed on the second reaction site.

In certain embodiments, a compound including a hydrogen atom may be introduced to the object to partially be reacted with the first reaction site, thereby transforming the first reaction site into the second reaction site.

In certain embodiments, the compound including the hydrogen atom may include hydrogen, ammonia or deionized water. These may be used alone or in a combination thereof.

In certain embodiments, the compound including the hydrogen atom may be introduced to the object at a flow rate ranging between about 50 to 1,000 sccm for about 3 to 30 seconds.

In certain embodiments, the first precursor may be introduced to the object at a flow rate less than about 1,000 sccm for less than about 30 seconds.

In certain embodiments, the first reaction site may have a substantially higher reactivity with respect to the first precursor than the second reaction site.

In certain embodiments, the second central atom may include one of silicon and titanium.

According to certain embodiments of the inventive concept, in formation of a target layer including a plurality of materials, a composition ratio of materials included in the layer may be efficiently adjusted. Thus, when the layer includes a small quantity of the materials, the composition ratio may be correctly controlled in the layer. Additionally, a process condition may maintain constant for a formation of the layer to form the layer having a uniform composition ratio of the materials from a lower portion to an upper portion of the layer.

BRIEF DESCRIPTION OF THE DRAWINGS

Embodiments will be more clearly understood from the following detailed description taken in conjunction with the accompanying drawings.

DETAILED DESCRIPTION OF THE EMBODIMENTS

Figure 1:
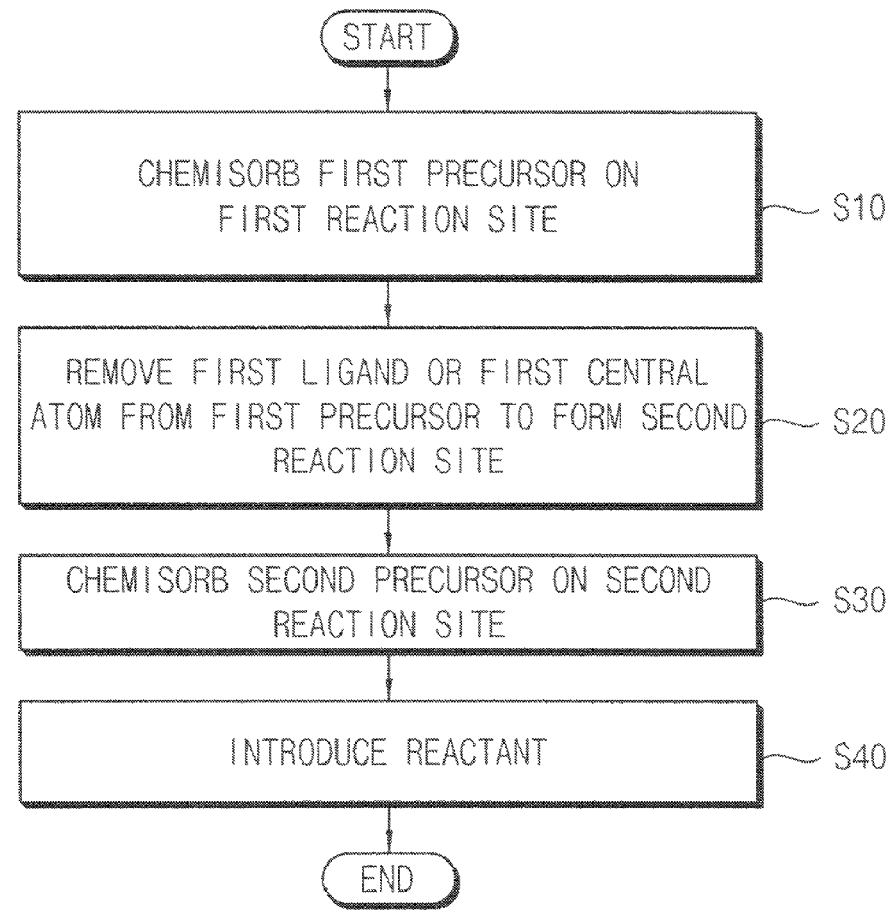
FIGS. 1, 3 and 5 are flow charts summarizing methods of forming a layer in accordance with certain embodiments of the inventive concept.

Various embodiments will be described more fully hereinafter with reference to the accompanying drawings. The present inventive concept may, however, be embodied in many different forms and should not be construed as being limited to only the illustrated embodiments. Rather, these embodiments are presented as teaching examples. In the drawings, the size of a layer and relative sizes between related layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. In the drawings and written description, like reference numbers and labels denote like or similar elements. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be explained in some additional detail with reference to the accompanying drawings.

FIG. 1 is a flow chart summarizing a method of forming a target layer in accordance with certain embodiments of the inventive concept. FIGS. 2A through 2E are related cross-sectional views further illustrating the method of forming the target layer.

A "reaction site" in the context of the illustrated embodiments comprises an exposed functional group capable of reacting with a precursor introduced onto the location of the reaction site. The reaction site may be a terminal group formed on an existing layer or material, such as a substrate. As one example, FIGS. 2A through 2E illustrate a method of forming an oxide layer at a desired location using an oxygen atom as the reaction site. However, other embodiments of the inventive concept may form other material layer types, such as a nitride layer, at a desired location using another type of atom or functional group as the reaction site.

Figure 2A:
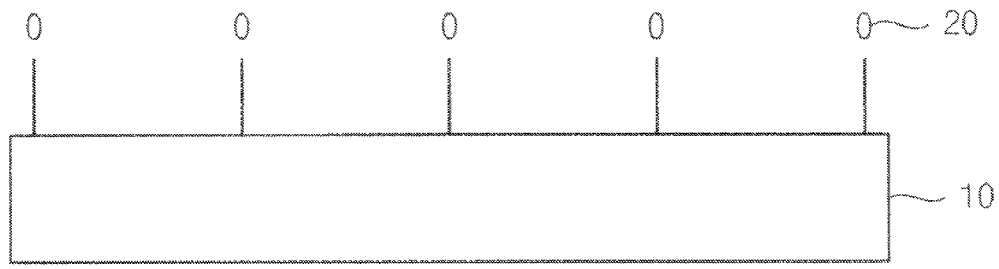
FIGS. 2A to 2E, 4A to 4D and 6A to 6E are cross sectional views illustrating certain methods of forming a layer in accordance with certain embodiments.
Figure 2B:
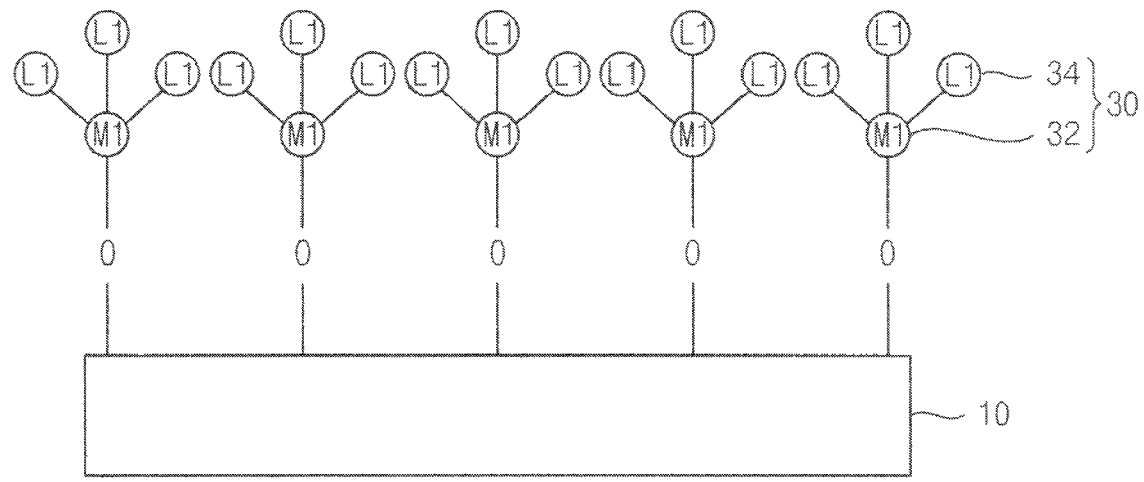

Referring collectively to FIGS. 1, 2A and 2B, a first precursor 30 is chemisorbed on a first reaction site 20 of an object 10 (S10). The first precursor 30 includes a first central atom 32 and a first ligand 34 associated with the first central atom 32.

In certain embodiments of the inventive concept, the object 10 may include a substrate on which a metal layer, a metal nitride layer, a metal oxide layer, etc., is formed. The substrate may include a semiconductor substrate such as silicon substrate, a germanium substrate, a silicon-germanium substrate, a silicon-on-insulator (SOI) substrate, a germanium-on-insulator (GOI) substrate, etc. Alternatively, the substrate may include a single crystalline metal oxide substrate such as a single crystalline aluminum oxide ($AlO_x$) substrate, a single crystalline strontium titanium oxide ($SrTiO_x$) substrate, a single crystalline magnesium oxide ($MgO_x$) substrate. For example, the object 10 may include a silicon substrate on which a titanium nitride layer is formed.

The first reaction site 20 is formed on the object 10. The type and number of first reaction site(s) 20 on the object 10 may be adjusted according to the surrounding atmospheric conditions associated with the object 10 and treatment of the object 10. In the illustrated embodiment, the first reaction site 20 may be assumed to include an oxygen atom when the object 10 is exposed to an oxygen ($O_2$) atmosphere or an ozone ($O_3$) atmosphere. For example, the first reaction site 20 on the object 10 may be an oxygen atom when the object 10 is treated with oxygen.

The first precursor 30 is provided on the object 10. As noted above, the first precursor 30 in the illustrated embodiment may be assumed to include the first central atom 32 and the first ligand 34 associated with the first central atom 32. The type of the first central atom 32 and the first ligand 34 may be adjusted in accordance with the desired properties of a target layer 60 ultimately formed on the object 10 (hereafter referred to as "the target layer").

For example, the first central atom 30 may include lithium (Li), beryllium (Be), boron (B), sodium (Na), magnesium (Mg), aluminum (Al), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), tellurium (Te), cesium (Cs), barium (Ba), lanthanum (La), lanthanide (Ln), hafnium (Hf), tantalum (Ta), tungsten (W), rhenium (Re), osmium (Os), iridium (Ir), platinum (Pt), gold (Au), thallium (Tl), mercury (Hg), lead (Pb), bismuth (Bi), polonium (Po), francium (Fr), radium (Ra), actinium (Ac) or actinide (An). These may be used alone or in combination. For example, the first central atom 32 may include zirconium, strontium, silicon, titanium or hafnium.

A type of the first ligand 34 associated with the first central atom 32 may be adjusted according to the type of the first central atom 32. For example, the first ligand 34 may include a halogen atom such as fluoro (F), chloro (Cl), bromo (Br), iodo (I), etc., a hydroxyl (OH) group, ammine ($NH_3$), an amine group having a carbon atom of about 1 to 10, an amido group ($NH_2$) or an amido group in which an alkyl group is substituted for a hydrogen atom, an alkoxy group, an aryl group, an allyl group, a dienyl group, a β-diketonate group, a β-ketoiminato group or a β-diiminato group. These may be used alone or in combination.

The first precursor 30 having the first central atom 32 and the first ligand 34 is bonded to the first reaction site 20. The first central atom 32 in the first precursor 30 may be reacted with the first reaction site 20 on the object 10 to be chemisorbed on the first reaction site 20.

In certain embodiments of the inventive concept, a purge process may be performed by introducing a purge gas to remove the residual (non-chemisorbed) portions of the first precursor 30. The purge process may be performed using an inactive gas such as argon (Ar), xenon (Xe), krypton (Kr), nitrogen ($N_2$), etc.

Figure 2C:
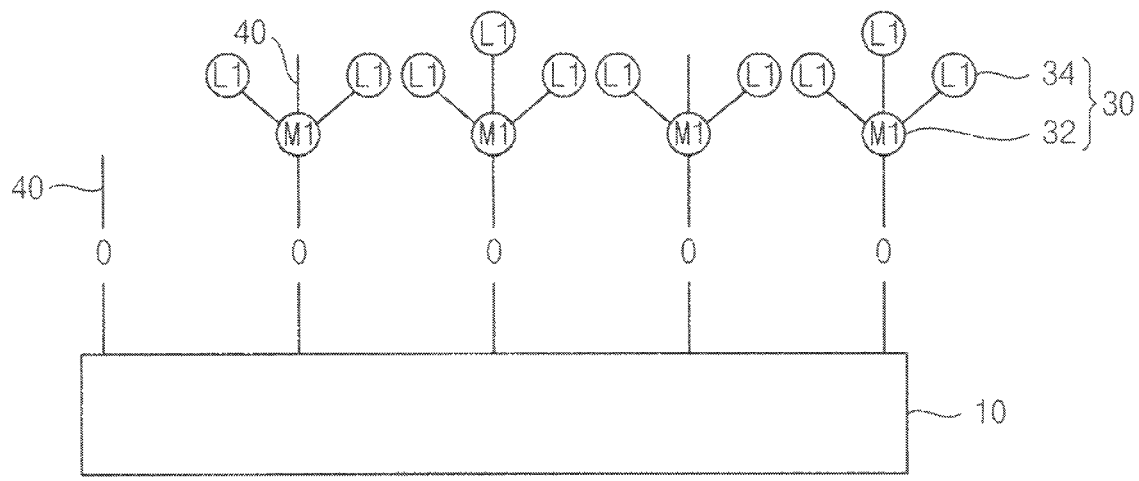

Referring now to FIGS. 1 and 2C, at least one of the first ligand 34 and the first central atom 32 of the first precursor 30 bonded to the first reaction site 20 is removed to form a second reaction site 40 (S20).

In certain embodiments of the inventive concept, the second reaction site 40 may be formed by performing a heat treatment. When the heat treatment is performed on the object 10, the first ligand 34 and/or the first central atom 32 is removed from the first precursor 30 bonded to the first reaction site 20. The heat treatment may be performed at a temperature in a range of between about 200° C. to 400° C.

In other embodiments of the inventive concept, the second reaction site 40 may be formed by performing a plasma treatment. When the plasma is provided to the object 10, the first ligand 34 and/or the first central atom 32 is removed from the first precursor 30 bonded to the first reaction site 20. The plasma treatment may be performed using an inactive gas such as nitrogen or argon by applying a bias power in a range of between about 100 W to 500 W. The plasma treatment may be performed at temperature in a range of between about 0° C. to 400° C., and at pressure in a range of between about 0.001 mTorr to 1 Torr.

In certain embodiments, when the first central atom 32 is removed from the first precursor 30 bonded to the first reaction site 20, the second reaction site 40 may be substantially the same as the first reaction site 20. For example, the first and second reaction sites 20 and 40 may be an oxygen atom. In other embodiments, when the first ligand 34 is removed from the first precursor 30 bonded to the first reaction site 20, the second reaction site 40 may be substantially different form the first reaction site 20. Here, the second reaction site 40 may be the first central atom 32 of the first precursor 30.

When a second precursor 50 (see FIG. 2D) is introduced on the object 10 during a subsequent process, the second precursor 50 may be bonded to the second reaction site 40. As a result, when the target layer 60 is formed using a plurality of precursors, the number of the second reaction site(s) 40 may affect a composition ratio of the constituent materials included in the target layer 60. That is, a ratio between the second reaction site 40 and the first reaction site 20 may be efficiently adjusted during the heat treatment or the plasma treatment. That is, when the target layer 60 including a plurality of materials is formed on the object 10, a process condition of the heat treatment or the plasma treatment may be controlled to adjust the composition ratio of materials included in the target layer 60. For example, when an atomic ratio between the first central atom 32 and a second central atom 52 included in the target layer 60 is between about 9:1 to 10:1, the number of the second reaction site 40 may be decreased by reducing the temperature of the heat treatment or reducing the process time of the applied plasma treatment.

Figure 2D:
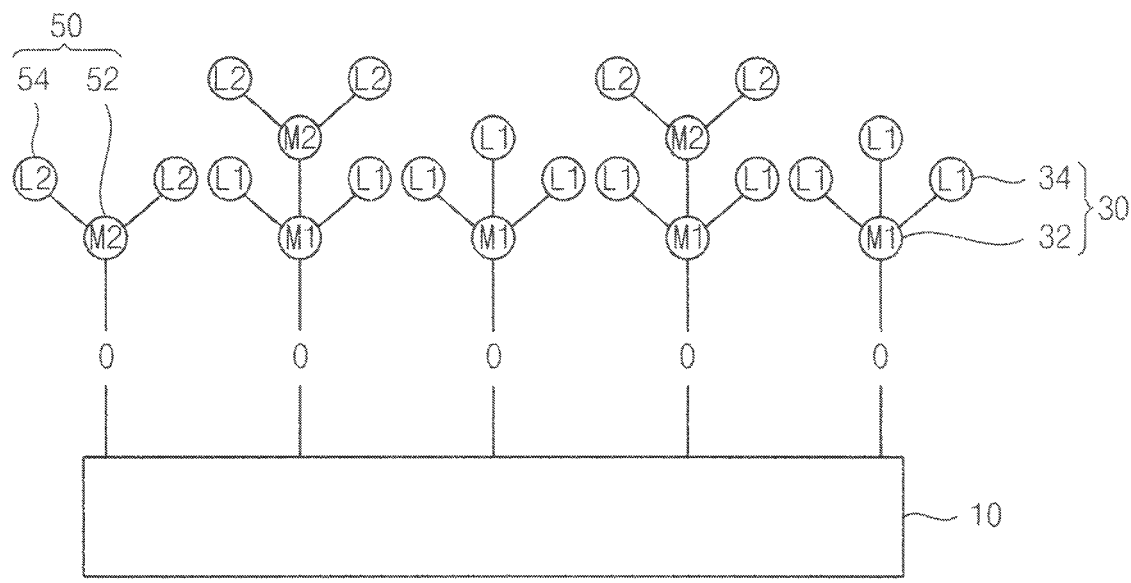

Referring now to FIGS. 1 and 2D, the second precursor 50 is bonded to the second reaction site 40 (S30).

The second precursor 50 is introduced on the object 10 to be chemisorbed on the second reaction site 40. The first and second precursors 30 and 50 may be bonded to the object 10 with a predetermined number ratio by introducing the second precursor 50. The ratio between the first and second precursors 30 and 50 bonded to the object 10 may be efficiently adjusted according to the number of second reaction site(s) 40. Thus, the ratio between the first and second precursors 30 and 50 bonded to the object 10 may be accurately controlled, even when the percentage of second precursors 50 is less than 10 percent of the total number of first and second precursors 30 and 50 bonded to the object 10.

The second precursor 50 may include the second central atom 52 and a second ligand 54 associated with the second central atom 52. A type of the second central atom 52 and the second ligand 54 may be adjusted according to the desired properties of the target layer 60 formed on the object 10.

The second central atom 52 of the second precursor 50 may be substantially different from the first central atom 32 of the first precursor 30. In embodiments, the second central atom 52 of the second precursor 50 may include lithium, beryllium, boron, sodium, magnesium, aluminum, potassium, calcium, scandium, titanium, vanadium, chromium, manganese, iron, cobalt, nickel, copper, zinc, gallium, germanium, rubidium, strontium, yttrium, zirconium, niobium, molybdenum, technetium, ruthenium, rhodium, palladium, silver, cadmium, indium, tin, antimony, tellurium, cesium, barium, lanthanum, lanthanide, hafnium, tantalum, tungsten, rhenium, osmium, iridium, platinum, gold, thallium, mercury, lead, bismuth, polonium, francium, radium, actinium or actinide. These may be used alone or in combination. For example, the second central atom 52 may include zirconium, strontium, silicon, titanium or hafnium.

The second ligand 54 associated with the second central atom 52 may be adjusted according to the second central tom 52. The second ligand 54 may include a halogen atom such as fluoro, chloro, bromo, iodo, etc., a hydroxyl group, amine, an amine group having a carbon atom of about 1 to 10, an amido group or an amido group in which an alkyl group is substituted for a hydrogen atom, an alkoxy group, an aryl group, an allyl group, a dienyl group, a β-diketonate group, a β-ketoiminato group or a β-diiminato group. These may be used alone or in combination.

In certain embodiments, a purge process may be performed by introducing a purge gas to remove a non-chemisorbed second precursor 50. The purge process may be performed using an inactive gas such as argon, xenon, krypton, nitrogen, etc.

Figure 2E:
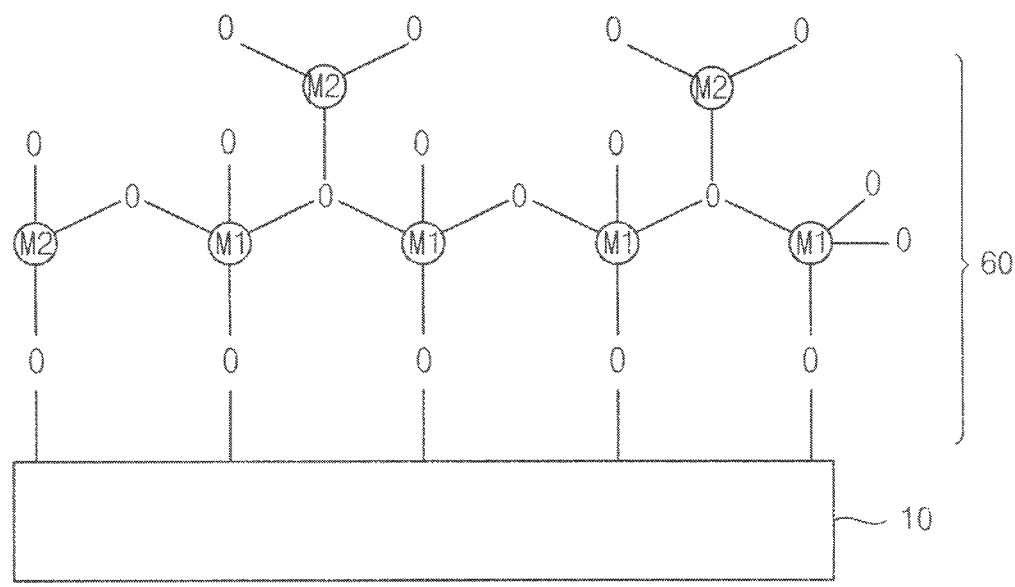

Referring to FIGS. 1 and 2E, a reactant capable of being bonded to the first and second central atoms 32 and 52 is introduced onto the object 10 to form the target layer 60 including the plurality of materials (S40). The first and second ligands 34 and 54 may be removed form the first and second precursors 30 and 50, respectively, by introducing the reactant to form the target layer 60 including the first and second central atoms 32 and 52.

In certain embodiments, the reactant may include a compound having an oxygen atom and/or nitrogen atom. For example, the reactant may include ozone ($O_3$), oxygen ($O_2$), water vapor ($H_2O$), an oxygen plasma, an ozone plasma, ammonia ($NH_3$), nitrogen dioxide ($NO_2$), nitrous oxide ($N_2O$), etc.

In certain embodiments, the reactant may be bonded to both the first and second central atoms 32 and 52. In other embodiments, the reactant may be bonded to one of the first central atom 32 and the second central atom 52 by substituting for one of the first ligand 34 and the second ligand 54, respectively.

When the first and second central atoms 32 and 52 include a metal and the reactant include the oxygen atom, the target layer 60 formed on the object 10 may include a metal oxide layer including two types of metal oxides. When the first and second central atoms 32 and 52 include a metal and the reactant include the nitrogen atom, the target layer 60 formed on the object 10 may include a metal nitride layer including two types of metal nitrides. In one embodiment, the first central atom 32 may include zirconium or hafnium and the second central atom 52 may include silicon. Here, when the reactant includes oxygen or ozone, the target layer 60 may include hafnium silicate or zirconium silicate. In another embodiment, the first central atom 32 may include strontium and the second central atom 52 may include titanium. Here, when the reactant includes oxygen or ozone, the target layer 60 may include strontium titanium oxide.

A unit cycle including an introduction of the first precursor 30, a formation of the second reaction site 40, an introduction of the second precursor 50 and an introduction of the reactant may be repeated until the target layer 60 on the object 10 has a desired thickness.

According to certain embodiments of the inventive concept, the second reaction site 40 may be formed by removing the first central atom 32 or the first ligand 34 from the first precursor 30 bonded to the first reaction site 20. The atomic number ratio between the first and second central atoms 32 and 52 included in the target layer 60 may be controlled according to the ratio of the first and the second reaction sites 20 and 40 formed on the object 10. Therefore, when the target layer 60 includes only a small quantity of the first central atom 32 or a small quantity of the second central atom 52, the target layer 60 having a predetermined atomic number ratio, as between the first and second central atoms 32 and 52, may be efficiently formed on the object 10. Additionally, when the target layer 60 having the predetermined thickness is formed by repeated applications of a unit cycle, the process condition (s) for the heat treatment or plasma treatment may be appropriately adjusted for each unit cycle in order to maintain the defined ratio between the first and second reaction sites 20 and 40. Thus, the atomic number ratio between the first and second central atoms 32 and 52 included in the target layer 60 may keep constant across the entire thickness of the layer (i.e., from a lower portion of the target layer 60 to an upper portion of the target layer 60).

Hereinafter, a method of forming a target layer in accordance with other embodiments of the inventive concept will be explained in some additional detail with reference to the accompanying drawings.

Figure 3:
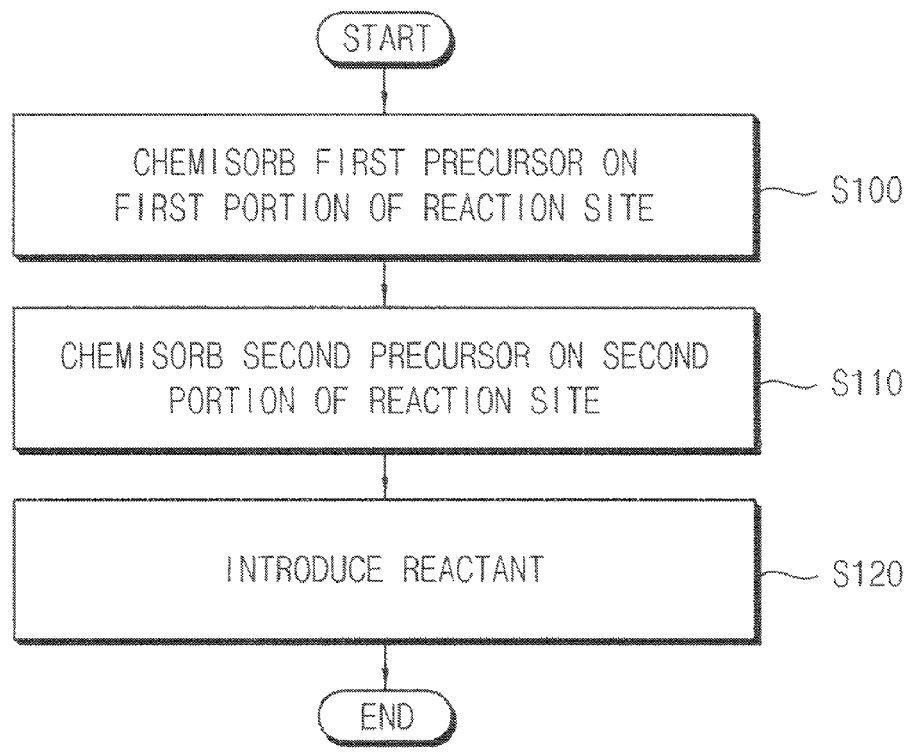

FIG. 3 is a flow chart summarizing a method of forming a target layer in accordance with certain embodiments of the inventive concept. FIGS. 4A through 4D are related cross-sectional views further illustrating the method of forming the target layer.

As before, a reaction site in accordance with the illustrated embodiments may have an exposed functional group capable of being reacted with a precursor introduced onto an object. The reaction site may be a terminal group formed on the object. Although FIGS. 4A to 4D illustrate a method of forming an oxide layer on the object using an oxygen atom as the reaction site, other embodiments of the inventive concept may be to form other layer types, such as a nitride layer using another type of atom or functional group as the reaction site.

Figure 4A:
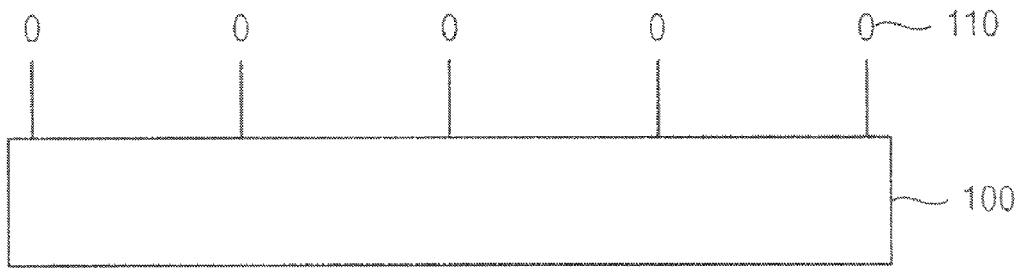
Figure 4B:
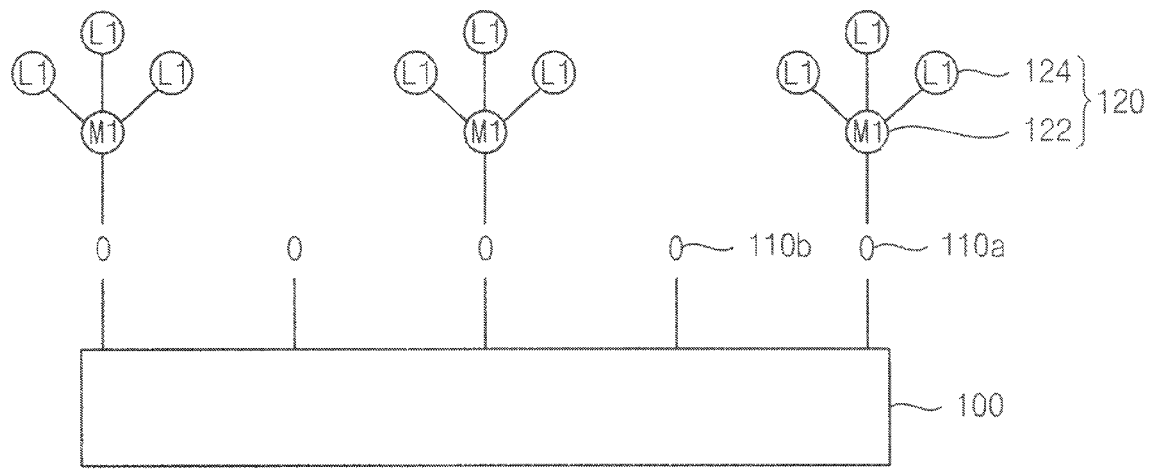

Referring to FIGS. 3, 4A and 4B, a first precursor 120 is bonded to a first portion 110a of a reaction site 110 (S100). The first precursor 120 may include a first central atom 122 and the first ligand 124 associated with the first central atom 122.

In certain embodiments, the object 100 may include a substrate on which a metal layer, metal nitride layer, metal oxide layer, etc. is formed. The substrate may include a semiconductor substrate such as silicon substrate, a germanium substrate, a silicon-germanium substrate, a silicon-on-insulator substrate, a germanium-on-insulator substrate, etc. Alternatively, the substrate may include a single crystalline metal oxide substrate such as a single crystalline aluminum oxide substrate, a single crystalline strontium titanium oxide substrate, a single crystalline magnesium oxide substrate. For example, the object 100 may be a silicon substrate on which a titanium nitride layer is formed.

The reaction site 110 is formed on the object 100. The type and number of the reaction site(s) 110 on the object 100 may be adjusted according to the surrounding atmospheric conditions associated with the object 100 and treatment with respect to the object 100. In embodiments, the reaction site 110 may include an oxygen atom when the object 100 is under an oxygen atmosphere or an ozone atmosphere. For example, the reaction site 110 on the object 100 may be an oxygen atom when the object 100 is treated with oxygen.

The first precursor 120 is bonded to the first portion 110a of the reaction site 110. The first central atom 122 in the first precursor 120 may be partially reacted with the reaction site 110 on the object 100. That is, some of the reaction sites 110 may be reacted with the first precursor 120 and the others of the reaction sites 110 may not be reacted with the first precursor 120. A portion on which the first precursor 120 is chemisorbed may be the first portion 110a of the reaction site 110 and a portion on which the first precursor 120 is not chemisorbed may be a second portion 110b of the reaction site 110.

The type of the first precursor 110 including the first central atom 122 and the first ligand 124 may be adjusted according to the desired properties of a target layer 140 (see FIG. 4D) which will be formed on the object 100. In certain embodiments, the first central atom 122 may include lithium, beryllium, boron, sodium, magnesium, aluminum, potassium, calcium, scandium, titanium, vanadium, chromium, manganese, iron, cobalt, nickel, copper, zinc, gallium, germanium, rubidium, strontium, yttrium, zirconium, niobium, molybdenum, technetium, ruthenium, rhodium, palladium, silver, cadmium, indium, tin, antimony, tellurium, cesium, barium, lanthanum, lanthanide, hafnium, tantalum, tungsten, rhenium, osmium, iridium, platinum, gold, thallium, mercury, lead, bismuth, polonium, francium, radium, actinium or actinide. These may be used alone or in combination. For example, the first central atom 122 may include zirconium, strontium, silicon, titanium or hafnium. In embodiments, the first ligand 124 may include a halogen atom such as fluoro, chloro, bromo, iodo, etc., a hydroxyl group, amine, an amine group having a carbon atom of about 1 to 10, an amido group or an amido group in which an alkyl group is substituted for a hydrogen atom, an alkoxy group, an aryl group, an allyl group, a dienyl group, a β-diketonate group, a β-ketoiminato group or a β-diiminato group. These may be used alone or in combination.

In certain embodiments, the first precursor 120 may be provided to the object 100 at a flow rate ranging between about 50 sccm to 1,000 sccm for about 3 seconds to 30 seconds. When the first precursor 120 is provided to the object 100 at a flow rate greater than about 1,000 sccm for greater than about 30 seconds, the first precursor 120 may be bonded to all the first reaction sites 110. Therefore, when the first precursor 120 is provided on the object 100 at a flow rate less than about 1,000 sccm or the first precursor 120 is provided on the object 100 for less than about 30 seconds, the first precursor 120 may be insufficient such that the first precursor 120 may not be chemisorbed the second portion 110b of the reaction sites 110. When the first precursor 120 is provided at a flow rate less than about 50 sccm or for less than about 3 seconds, the first precursor 120 may not be chemisorbed on the first portion 110a to the reaction site 110.

The second portion 110b on which the first precursor 120 is not chemisorbed may be reacted with a second precursor 130 (see FIG. 4B). Therefore, a composition ratio of materials included in the target layer 140 (see FIG. 4D) may be adjusted according to introduction quantity of the first precursor 120. When a large quantity of the first precursor 120 is introduced to the object 100, the target layer 140 will have the first central atom 122 in greater proportion (i.e., a higher atomic number ratio with respect) to the second central atom 132. However, when a relatively small quantity of the first precursors 120 is introduced to the object 100, the target layer 140 will have the first central atom 122 in a lesser proportion (i.e., a lower atomic number ratio with respect) to the second central atom 132.

Figure 4C:
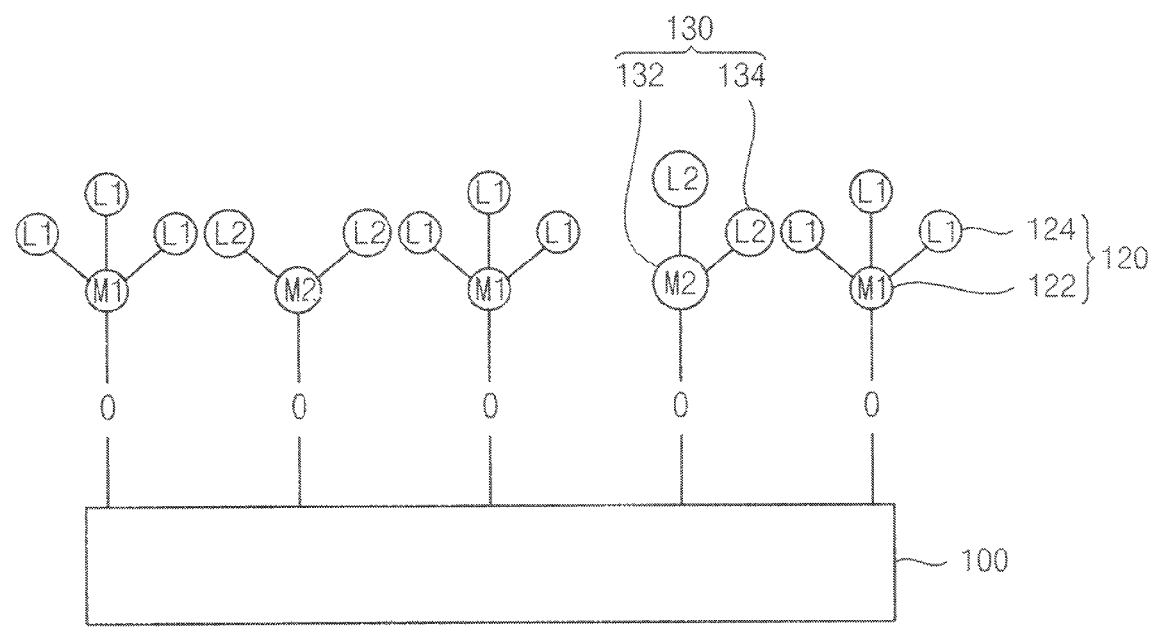

Referring to FIGS. 3 and 4C, the second precursor 130 is bonded to the second portion 110b of the reaction site 110 (S110).

The second precursor 130 may include the second central atom 132 and a second ligand 134 associated with the second central atom 132. A type of the second precursor 130 including the second central atom 132 and the second ligand 134 may be adjusted according to the desired properties of the target layer 140. When the target layer 140 includes a plurality of materials, the second central atom 132 may be substantially different from the first central atom 122. In one embodiment, the first central atom 122 of the first precursor 120 may include hafnium or zirconium and the second central tom 132 of the second precursor 130 may include silicon. In another embodiment, first central atom 122 of the first precursor 120 may include strontium and the second central tom 132 of the second precursor 130 may include titanium.

When the second precursor 130 is introduced on the object 100, the second precursor 130 may be chemisorbed on the second portion 110b on the object 100. The second precursor 130 may be excessively provided to the object 100 to be sufficiently chemisorbed to the second portion 110b of the reaction site 110. In certain embodiments, the second precursor 130 may be provided to the object 100 at a flow rate greater than about 1,000 sccm for greater than about 30 seconds.

The second precursor 130 is chemisorbed on a surface of the object 100 so the first and second precursors 120 and 130 may be bonded to the first and second portions 110a and 110b of the reaction site 110, respectively. A composition ratio of the first and second precursors 120 and 130 chemisorbed on the object 100 may be controlled by the introduction amount of the first precursor 120.

In certain embodiments, a purge process may be performed by introducing a purge gas to remove a non-chemisorbed second precursor 130 from the object 10.

Figure 4D:
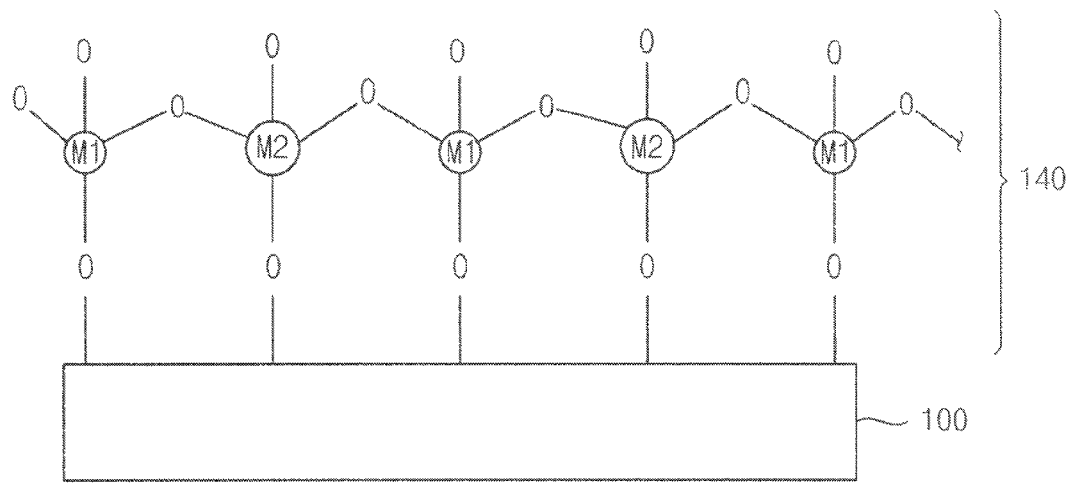

Referring to FIGS. 3 and 4D, a reactant capable of being bonded to the first and second central atoms 122 and 132 is introduced on the object 100 to form the target layer 140 including a plurality of materials (S120). The first and second ligands 124 and 134 may be removed from the first and second precursors 120 and 130, respectively, by introducing the reactant to form the target layer 140 including the first and second central atoms 122 and 132.

In certain embodiments, the reactant may include a compound having an oxygen atom and/or nitrogen atom. For example, the reactant may include ozone ($O_3$), oxygen ($O_2$), water vapor ($H_2O$), an oxygen plasma, an ozone plasma, ammonia ($NH_3$), nitrogen dioxide ($NO_2$), nitrous oxide ($N_2O$), etc.

When the first and second central atoms 122 and 132 include a metal and the reactant includes the oxygen atom, the target layer 140 on the object 100 may include a metal oxide layer including two types of metal oxides. When the first and second central atoms 122 and 132 include a metal and the reactant includes the nitrogen atom, the target layer 140 on the object 100 may include a metal nitride layer including two types of metal nitrides. In one embodiment, the first central atom 122 may include zirconium or hafnium and the second central atom 132 may include silicon. Here, when the reactant includes oxygen or ozone, the target layer 140 may include hafnium silicate or zirconium silicate. In another embodiment, the first central atom 122 may include strontium and the second central atom 132 may include titanium. Here, when the reactant includes oxygen or ozone, the target layer 140 may include strontium titanium oxide.

A unit cycle including introduction of the first precursor 120, introduction of the second precursor 130, and introduction of the reactant may be repeated until the target layer 140 on the object 100 has a predetermined thickness.

According to certain embodiments, the first precursor 120 may be insufficiently provided to be bonded to the first portion 110a of the reaction site 110. As a result, the second portion 110b of the reaction site 110 on which the first precursor 120 is not chemisorbed may be formed on the object 100. Thus, the atomic number ratio of the first and second central atoms 122 and 132 included in the target layer 140 may be efficiently adjusted by the introduction quantity of the first precursor 120. When the target layer 140 includes a very small quantity of the first precursor 120 or the second precursor 130, the target layer 140 having a predetermined atomic number ratio of the first and second central atom 122 and 132 may be efficiently formed on the object 100. Additionally, when the target layer 140 having the predetermined thickness is formed by repeated application of the unit cycle, the introduction quantity of the first precursor 120 may be appropriately adjusted per the unit cycle to maintain the atomic number ratio of the first and second central atom 122 and 132. Thus, the atomic number ratio of the first and second central atom 122 and 132 included in the target layer 140 may keep constant across its thickness (i.e., from a lower portion of the target layer 140 to an upper portion of the target layer 140).

Hereinafter, a method of forming a target layer in accordance with other embodiments of the inventive concept will be explained in some additional detail with reference to the accompanying drawings.

Figure 5:
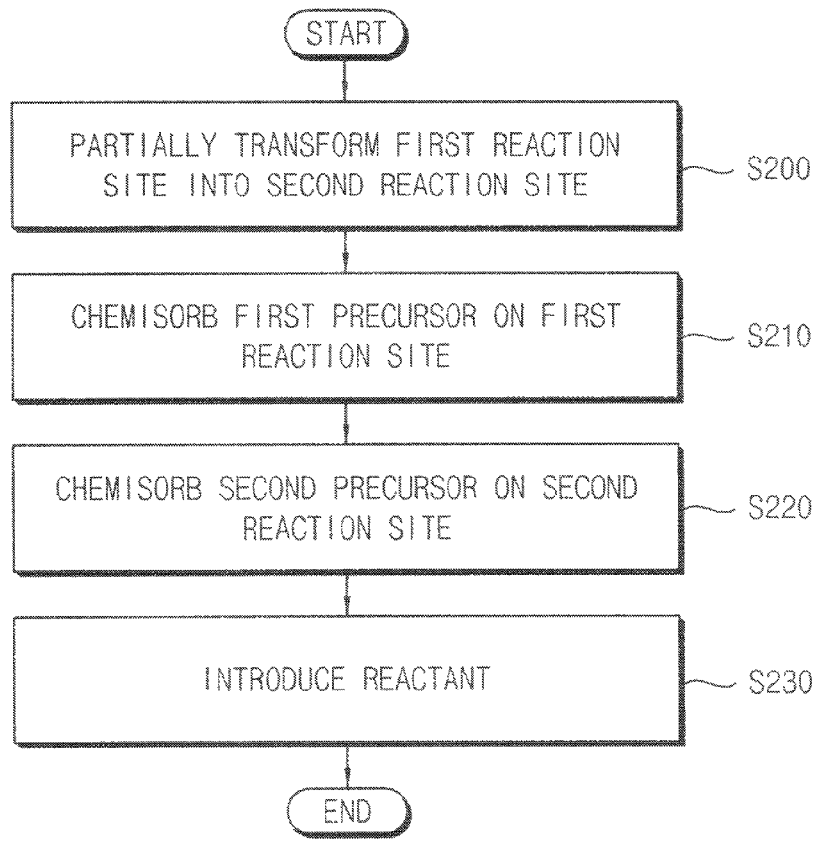

FIG. 5 is a flow chart summarizing a method of forming a target layer in accordance with certain embodiments of the inventive concept. FIGS. 6A through 6E are related cross-sectional views further illustrating the method of forming the target layer.

As before, a reaction site in accordance with embodiments of the inventive concept may have an exposed functional group capable of being reacted with a precursor introduced on an object. The reaction site may be a terminal group formed on the object. Although FIGS. 6A through 6E illustrate a method of forming an oxide layer on the object using an oxygen atom as the reaction site, other embodiments of the inventive concept may be used to form other layer types, such as a nitride layer, using other atom or functional groups as the reaction site.

Figure 6A:
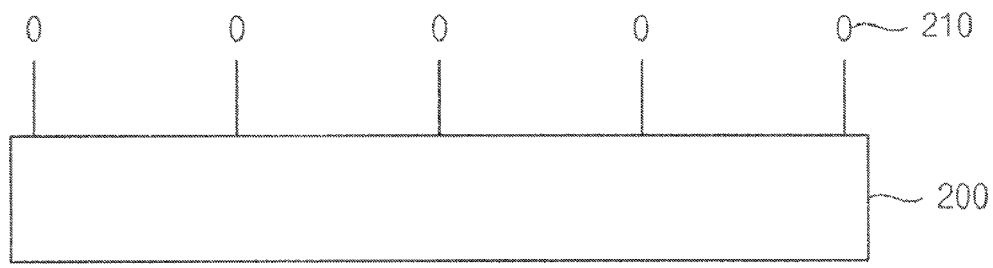
Figure 6B:
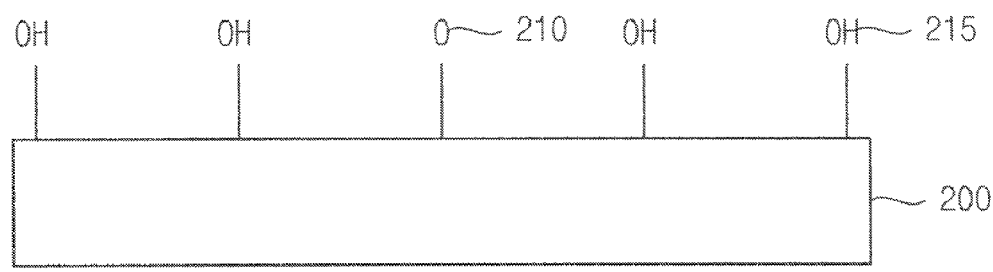

Referring to FIGS. 5, 6A and 6B, a first reaction site 210 on an object 200 is transformed into a second reaction site 215 on the object 200 (S200). The first reaction site 210 may have a substantially different reactivity from the second reaction site 215 with respect to a first precursor 220 (see FIG. 6C), which is introduced onto the object 200 in a subsequent process. Thus, the first precursor 220 may be selectively bonded to the first reaction site 210 or the second reaction site 215.

In certain embodiments, the object 200 may include a substrate on which a metal layer, a metal nitride layer, a metal oxide layer, etc. is formed. The substrate may include a semiconductor substrate such as silicon substrate, a germanium substrate, a silicon-germanium substrate, a silicon-on-insulator substrate, a germanium-on-insulator substrate, etc. Alternatively, the substrate may include a single crystalline metal oxide substrate such as a single crystalline aluminum oxide substrate, a single crystalline strontium titanium oxide substrate, a single crystalline magnesium oxide substrate. For example, the object 200 may be a silicon substrate on which a titanium nitride layer is formed.

The first reaction site 210 is formed on a surface of the object 200. The type and number of the first reaction site(s) 210 on the object 200 may be adjusted according to the atmospheric conditions surrounding the object 200 and treatment with respect to the object 200. In certain embodiments, the first reaction site 210 may include an oxygen atom when the object 200 is under an oxygen atmosphere or an ozone atmosphere. For example, the first reaction site 210 on the object 200 may be an oxygen atom when the object 200 is treated with oxygen.

A compound including a hydrogen atom is provided to the object 200 to transform some of the first reaction sites 210 into the second reaction sites 215. Some of the first reaction site 210 may be reacted with the compound including the hydrogen atom to form the second reaction site 215 so that the second reaction site 215 may have a substantially different reactivity from the first reaction site 210 with respect to the first precursor 220. Thus, when the first precursor 220 is provided onto the object 200, the first precursor 220 may be selectively chemisorbed on one of the first reaction site 210 or the second reaction site 220. In certain embodiments, the second reaction site 215 may have a substantially lower reactivity than the first reaction site 210 with respect to the first precursor 220. Here, when the first precursor 220 is provided onto the object 200, the first precursor 220 may be selectively chemisorbed on the first reaction site 210.

In certain embodiments of the inventive concept, the compound including the hydrogen atom may include ammonia ($NH_3$), hydrogen ($H_2$) or deionized water ($H_2O$). These may be used alone or in combination.

In certain embodiments, the compound including the hydrogen atom may be provided on the object 200 at a flow rate ranging between about 50 to 1,000 sccm for about 3 to 30 seconds. When the compound including the hydrogen atom is provided on the object 200 at a flow rate greater than about 1,000 sccm for greater than about 30 seconds, the compound including the hydrogen atom may be reacted with all the first reaction sites 210. Therefore, when the compound including the hydrogen atom is provided on the object 200 at a flow rate less than about 1,000 sccm or the compound including the hydrogen atom is provided on the object 200 for less than about 30 seconds, the compound including the hydrogen atom may be reacted with some of the first reaction sites 210 to be transformed into the second reaction sites 215. When the compound including the hydrogen atom is provided to the object 200 at a flow rate less than about 50 sccm or the compound including the hydrogen atom is provided to the object 200 for less than about 3 seconds, the second reaction site 215 may not be formed on the object 200.

The number ratio of the first and second reaction site 210 and 215 may be adjusted according to an introduction quantity of the compound including the hydrogen atom. When plenty of the compounds including the hydrogen atom is provided on the object 200, plenty of the first reaction sites 210 may be transformed into the second reaction sites 215, so that a target layer 240 (see FIG. 6E) which will be formed on the object 200 in subsequent processes, may include a small quantity of a first central atom 222 (see FIG. 6C). That is, the target layer 240 may have the second central atom 232 of a higher atomic number ratio with the respect to the first central atom 222. When a small quantity of the compounds including the hydrogen atom is provided to the object 200, a small quantity of first reaction sites 200 may be transformed into the second reaction sites 215 so that the target layer 240 may include a plenty of the first central atoms 222. That is, the target layer 240 may have the first central atom 222 of a higher atomic number ratio with respect to the second central atom 232.

In certain embodiments, when the first reaction site 210 is the oxygen atom, the second reaction site 215 may include a hydroxyl group and thus the second reaction site 215 may have a substantially lower reactivity than the first reaction site 210 with respect to the first precursor 220

Figure 6C:
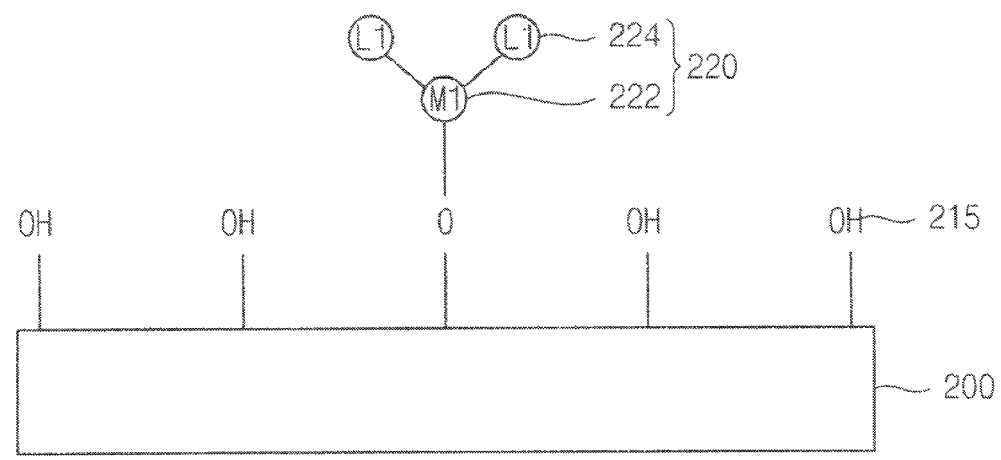

Referring to FIGS. 5 and 6C, the first precursor is introduced to the object 200 to be bonded to the first reaction site 210 (S210). The reactivity of the first reaction site 210 with respect to the first precursor 220 may be substantially higher than that of the second reaction site 215. Thus, the first precursor 220 may be selectively chemisorbed on the first reaction site 210.

The first precursor 220 may include the first central atom 222 and a first ligand 224. A type of the first central atom 222 and the first ligand 224 may be adjusted according to properties of the target layer 240 which will be formed on the object 200. In one embodiment, when the first reaction site 210 is the oxygen atom and the second reaction site 215 is the hydroxyl group, the first central atom 222 in the first precursor 220 may include a silicon atom. Here, the first precursor 220 including the silicon atom as the first central atom 222 may be selectively chemisorbed on the oxygen atom in the first reaction site 210. In another embodiment, when the first reaction site 210 is the oxygen atom and the second reaction site 215 is the hydroxyl group, the first central atom 222 in the first precursor 220 may include a titanium atom. Here, the first precursor 220 including the titanium atom as the first central atom 222 may be selectively chemisorbed on the oxygen atom in the first reaction site 210.

In certain embodiments, the first precursor 220 may be provided to the object 200 at a flow rate less than about 1,000 sccm for less than about 30 seconds. When the first precursor 220 is provided onto the object 200 at a flow rate greater than about 1,000 sccm for greater than about 30 seconds, the first precursor 220 may be bonded to the second reaction site 215.

Figure 6D:
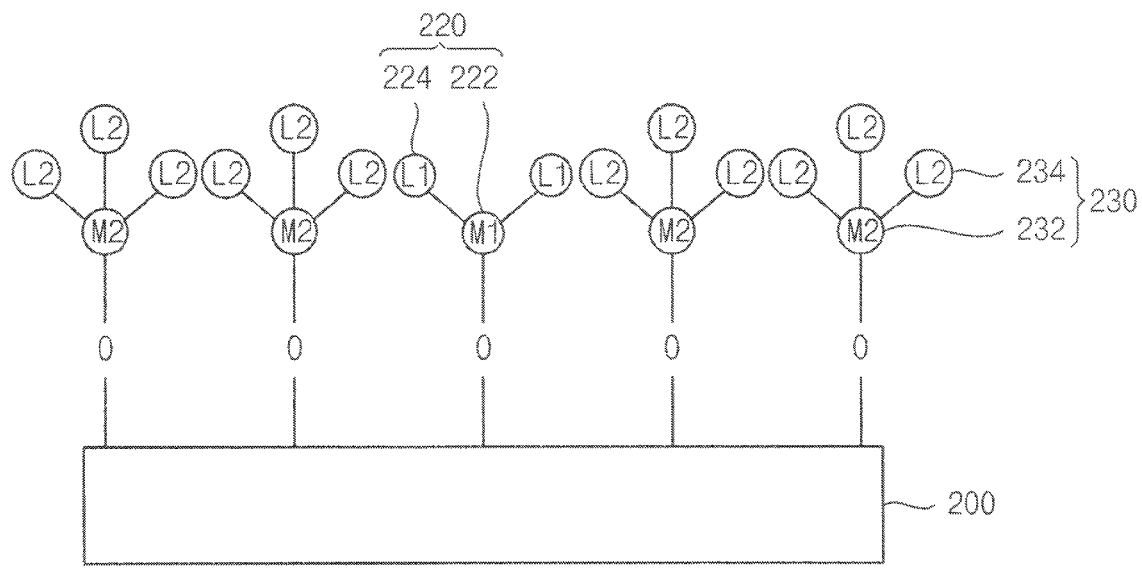

Referring to FIGS. 5 and 6D, the second precursor 230 is introduced to the object 200 to be bonded to the second reaction site 215 (S220).

The second precursor may 230 may include the second central atom 232 and a second ligand 234. A type of the second central atom 232 and the second ligand 234 may be adjusted according to properties of the target layer 240. The second central atom 232 of the second precursor 230 may be substantially different from the first central atom 222 of the first precursor 220. In one embodiment, when the first and second reaction site 210 and 215 are the oxygen atom and the hydroxyl group, respectively, and the first central atom 222 of the first precursor 220 is the silicon atom, the second central atom 232 of the second precursor 230 may include a hafnium atom or a zirconium atom. In another embodiment, when the first and second reaction site 210 and 215 are the oxygen atom and the hydroxyl group, respectively, and the first central atom 222 of the first precursor 220 include the titanium atom, the second central atom 232 of the second precursor 230 may include a strontium atom.

The second precursor 230 may be excessively provided onto the object 200 to be sufficiently chemisorbed on the second reaction site 215. For example, the second precursor 230 may be provided on the object 200 at a flow rate greater than about 1,000 sccm for greater than about 30 seconds.

Figure 6E:
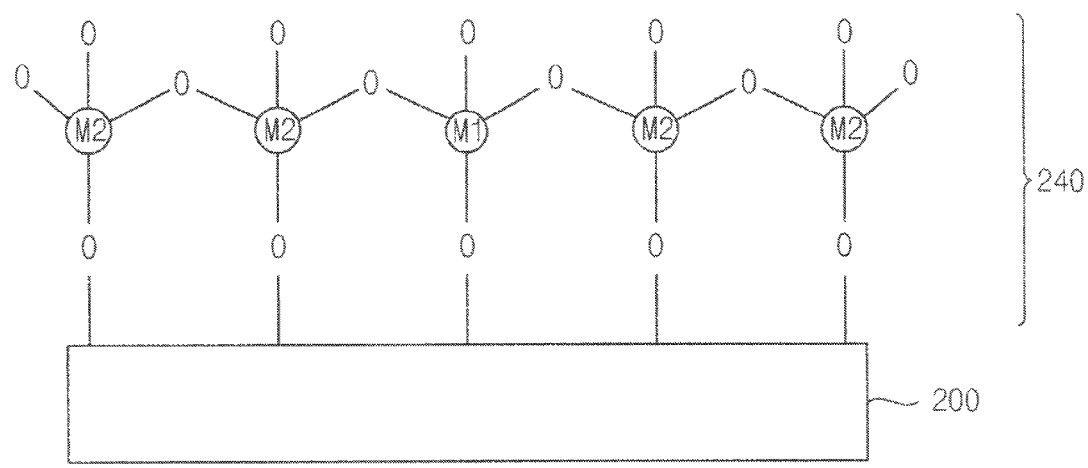

Referring to FIGS. 5 and 6E, a reactant capable of being bonded to the first and second central atoms 222 and 232 is introduced onto the object 200 to form the target layer 240 including a plurality of materials (S230). The first and second ligands 224 and 234 may be removed from the first and second precursors 220 and 230, respectively, by introducing the reactant to form the target layer 240 including the first and second central atoms 222 and 232.

In certain embodiments, the reactant may include a compound having an oxygen atom and/or nitrogen atom. For example, the reactant may include ozone ($O_3$), oxygen ($O_2$), water vapor ($H_2O$), an oxygen plasma, an ozone plasma, ammonia ($NH_3$), nitrogen dioxide ($NO_2$), nitrous oxide ($N_2O$), etc.

When the first and second central atoms 222 and 232 include a metal and the reactant includes the oxygen atom, the target layer 240 on the object 200 may include a metal oxide layer including two types of metal oxides. When the first and second central atoms 222 and 232 include a metal and the reactant includes the nitrogen atom, the target layer 240 on the object 200 may include a metal nitride layer including two types of metal nitrides. In one embodiment, the first central atom 222 may include the zirconium atom or the hafnium atom and the second central atom 232 may include the silicon atom. Here, when the reactant includes oxygen or ozone, the target layer 240 may include hafnium silicate or zirconium silicate. In another embodiment, the first central atom 222 may include the strontium atom and the second central atom 232 may include the titanium atom. Here, when the reactant includes oxygen or ozone, the target layer 240 may include strontium titanium oxide.

A unit cycle including introduction of the compound including the hydrogen atom, introduction of the first precursor 220, introduction of the second precursor 230 and introduction of the reactant may be repeated until the target layer 240 on the object 200 has the predetermined thickness.

According to certain embodiments, the compound including the hydrogen atom may be introduced to the object 200 to transform the first reaction site 210 into the second reaction site 215 having a substantially different reactivity from the first reaction site 210 with respect to the first precursor 220. The composition ratio of the materials included in the target layer 240 may be efficiently adjusted according to the introduction amount of the compound including the hydrogen atom. Thus, when the target layer 240 may include a small quantity of the first central atom 222 or a small quantity of the second central atom 232, the atomic number ratio of the first and second central atoms 222 and 232 may be correctly controlled in the target layer 240. Additionally, when the target layer 240 having the predetermined thickness is formed by repeating the unit cycle, the introduction amount of the compound including hydrogen atom may be appropriately adjusted per the unit cycle to maintain the number ratio of the first and the second reaction sites 210 and 215 on the object 200. Thus, the atomic number ratio of the first and second central atoms 222 and 232 may be constant across the thickness of the target layer 240 (i.e., from a lower portion of the target layer 240 to an upper portion of the target layer 240).

Figure 7:
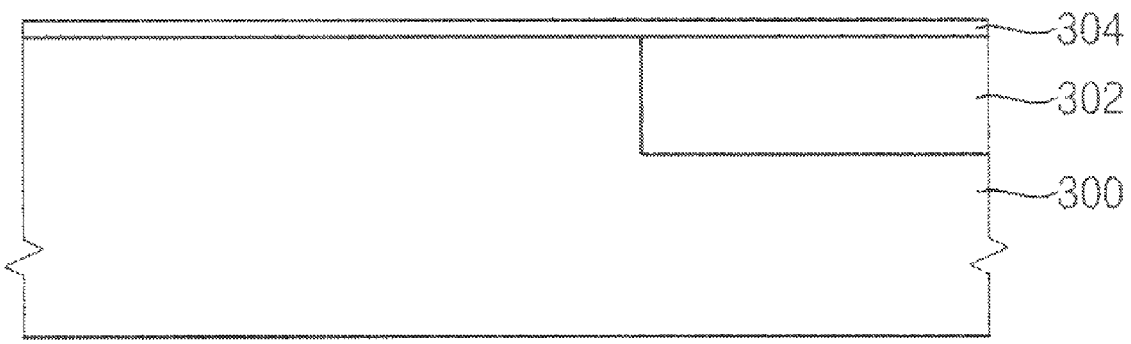
FIGS. 7, 8 and 9 are cross sectional views illustrating a method of forming a gate structure in accordance with certain embodiments.
Figure 8:
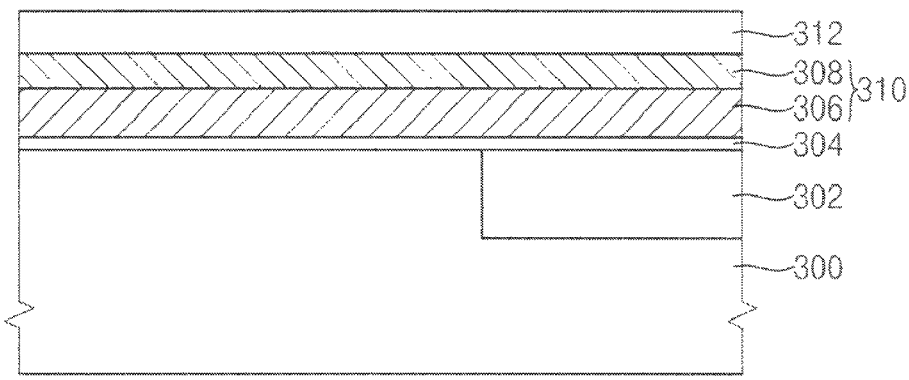
Figure 9:
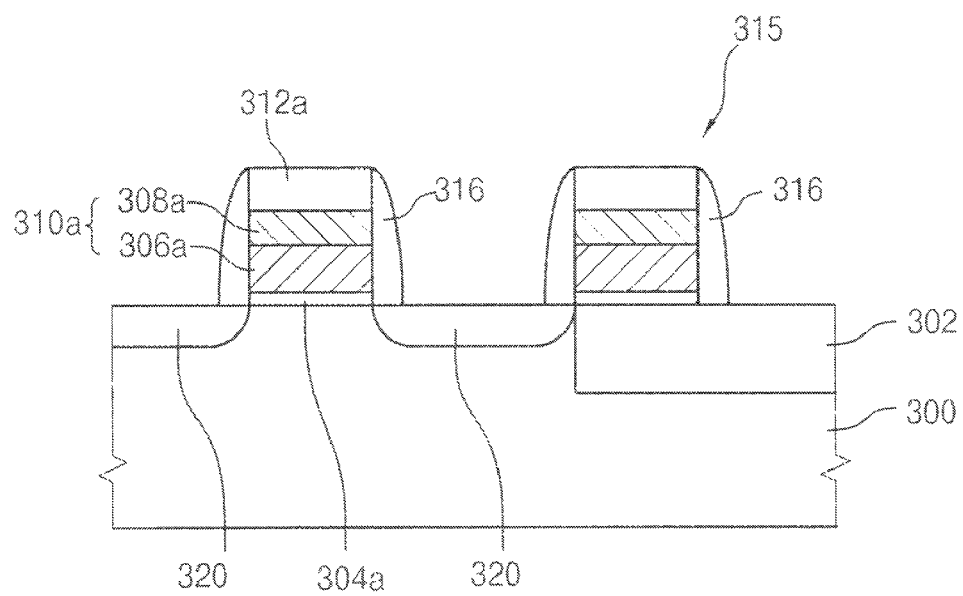

FIGS. 7, 8 and 9 are related cross-sectional views illustrating a method of forming a gate structure in accordance with certain embodiments of the inventive concept.

Referring to FIG. 7, an isolation layer 302 is formed on a substrate 300 to define an active region and a field region on the substrate 300.

The isolation layer 302 may be formed on the substrate 300 using an oxide such as silicon oxide by a thermal oxidation process or a shallow trench isolation (STI) process. The substrate 300 may include a semiconductor substrate such as silicon substrate, a germanium substrate, a silicon-germanium substrate, a silicon-on-insulator substrate, a germanium-on-insulator substrate, etc. Alternatively, the substrate may include a single crystalline metal oxide substrate such as a single crystalline aluminum oxide substrate, a single crystalline strontium titanium oxide substrate, a single crystalline magnesium oxide substrate.

A gate insulation layer 304 is formed on the substrate 300. The gate insulation layer 304 may have a thin equivalent oxidation thickness (EOT) and sufficiently reduce a leakage current between a gate conductive layer pattern 310a and a channel region. Thus, the gate insulation layer 304 may be formed using a material having a high dielectric ratio. When a layer includes a plurality of materials, the layer may have a substantially higher dielectric ratio than a silicon oxide layer to form a superior gate insulation layer 304.

In formation of the gate insulation layer 304, a first reaction site (not illustrated) may be formed on a surface of the substrate 300. The type and number of the first reaction site on the substrate 300 may be adjusted according to the atmospheric conditions surrounding the substrate 300 and a treatment with respect to the substrate 300. In embodiments, the first reaction site may include an oxygen atom when the substrate 300 is under an oxygen atmosphere or an ozone atmosphere. For example, the first reaction site on the substrate 300 may be an oxygen atom when the object 300 is treated with oxygen.

A first precursor, a second precursor and a reactant are introduced onto the substrate 300 to form the gate insulation layer 304 on the substrate 300. The first precursor may include a first central atom and a first ligand associated with the first central atom and a second precursor may include a second central atom and a second ligand associated with the second central atom. The reactant may be capable of being reacted with the first and second central atoms to be bonded to the first and second central atoms.

In one embodiment, the first precursor may be chemisorbed on the first reaction site on the substrate 300. Then the first central atom or the first ligand may be removed from the first precursor to form a second reaction site. The second precursor is provided to the substrate 300 to be chemisorbed onto the second reaction site. The reactant may be introduced to the substrate 300 to form the gate insulation layer 304 on the substrate 300.

In another embodiment, the first precursor may be chemisorbed on some of the first reaction site by insufficiently providing the first precursor into the substrate 300 to generate a second reaction site, on which the first precursor is not chemisorbed. The second precursor may be chemisorbed on the second reaction site by introducing the second precursor into the substrate 300. The reactant may be introduced to the substrate 300 to form the gate insulation layer 304 on the substrate 300.

In still another embodiment, a compound including a hydrogen atom may be reacted with the first reaction site on the substrate 300 to form a second reaction site having a substantially lower reactivity than the first reaction site. Then, the first precursor may be selectively chemisorbed onto the first reaction site by introducing the first precursor. The second precursor may be chemisorbed on the second reaction site by introducing the second precursor into the substrate 300. The reactant may be introduced to the substrate 300 to form the gate insulation layer 304 on the substrate 300.

Referring to FIG. 8, a gate conductive layer 310 is formed on the gate insulation layer 304. The gate conductive layer 310 may include a polysilicon layer 306 and a metal silicide layer 308. In certain embodiments, the metal silicide layer 308 may be formed using tungsten silicide, titanium silicide, tantalum silicide, cobalt silicide, etc.

A capping insulation layer 312 including silicon oxide may be formed on the gate conductive layer 310.

Referring to FIG. 9, the capping insulation layer 312, the gate conductive layer 310 and the gate insulation layer 304 may be patterned to form a gate structure 315. The gate structure 315 may include a capping insulation layer pattern 312a, the gate conductive layer pattern 310a including a polysilicon layer pattern 306a and a metal silicide layer pattern 308a and the gate insulation layer pattern 304a. In certain embodiments, the gate structure 315 may be formed by a photolithography process.

A gate spacer 316 is formed on a sidewall of the gate structure 315. In formation of the spacer 316, a nitride layer may be formed on the substrate 300 to cover the gate structure 315. The nitride layer may be anisotropically etched to form the gate spacer 316. For example, the gate spacer 316 may be formed using silicon nitride.

Impurities may be implanted into the substrate 300 adjacent to the gate structure 315 to form source/drain regions 320. For example, the source/drain regions 320 may be formed by an ion implantation process. The gate structure 315 and the gate spacer 316 may be used as a mask in the ion implantation process.

According to certain embodiments, the gate insulation layer 304 (i.e., a target layer) may include a plurality of materials. A composition ratio of materials included in the gate insulation layer 304 may be efficiently adjusted. Thus, when the gate insulation layer 304 includes a small quantity of the first central atom or a small quantity of the second central atom, the gate insulation layer 304 having a predetermined composition ratio of the materials may be formed. Additionally, a process condition may maintain constant during the processes to form the gate insulation layer 304 having a uniform composition ratio of materials from a lower portion to an upper portion of the gate insulation layer 304.

Hereinafter, a method of manufacturing a capacitor in accordance with embodiments will be explained in detail with reference to the accompanying drawings.

FIGS. 10, 11, 12, and 13 are related cross-sectional views illustrating the fabrication of a capacitor in accordance with certain embodiments of the inventive concept.

Figure 10:
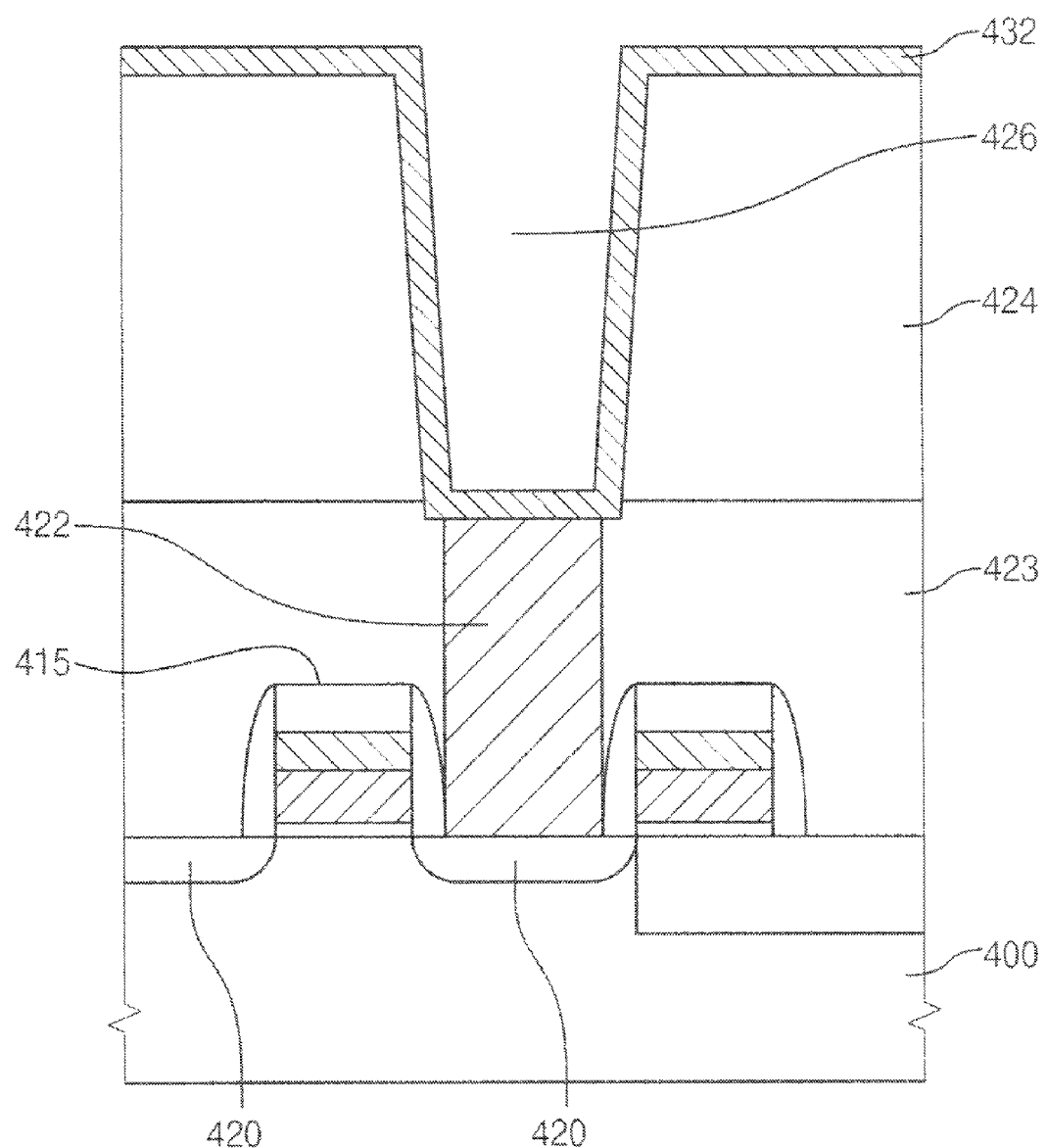
FIGS. 10, 11, 12 and 13 are cross sectional views illustrating a method of manufacturing a capacitor in accordance with certain embodiments.

Referring to FIG. 10, a substrate 400 having a conductive structure is provided. The conductive structure may include source/drain regions 420, a gate structure 415 having a gate insulation layer, a gate conductive layer, a gate spacer and a contact plug 422, etc.

A first insulation layer is formed on the substrate 400 to cover the contact plug 422. The first insulation layer may be etched until the contact plug 422 is exposed to a first insulation layer pattern 423. A second insulation layer pattern 424 having a contact hole 426 is formed on the first insulation layer pattern 423. The contact hole 426 may expose the contact plug 422.

In certain embodiments, the first and second insulation layer patterns 423 and 424 may be formed using an oxide, a nitride, an oxynitride, etc. For example, the first and second insulation layer patterns 423 and 424 may be formed using boro-phosphor silicate glass (BPSG), phosphor silicate glass (PSG), undoped silicate glass (USG), spin on glass (SOG), flowable oxide (FOX), tetraethylorthosilicate (TEOS), plasma enhanced tetraethylorthosilicate (PE-TEOS), high density plasma chemical vapor deposition (HDP-CVD) oxide, tonen silazene (TOSZ), etc.

A first conductive layer 432 is formed on the contact hole 426 and the second insulation layer pattern 424. The first conductive layer 432 may be formed using titanium, titanium nitride, tantalum, tantalum nitride, polysilicon, tungsten, tungsten nitride, ruthenium, etc. For example, the first conductive layer 432 may be formed using titanium nitride.

Figure 11:
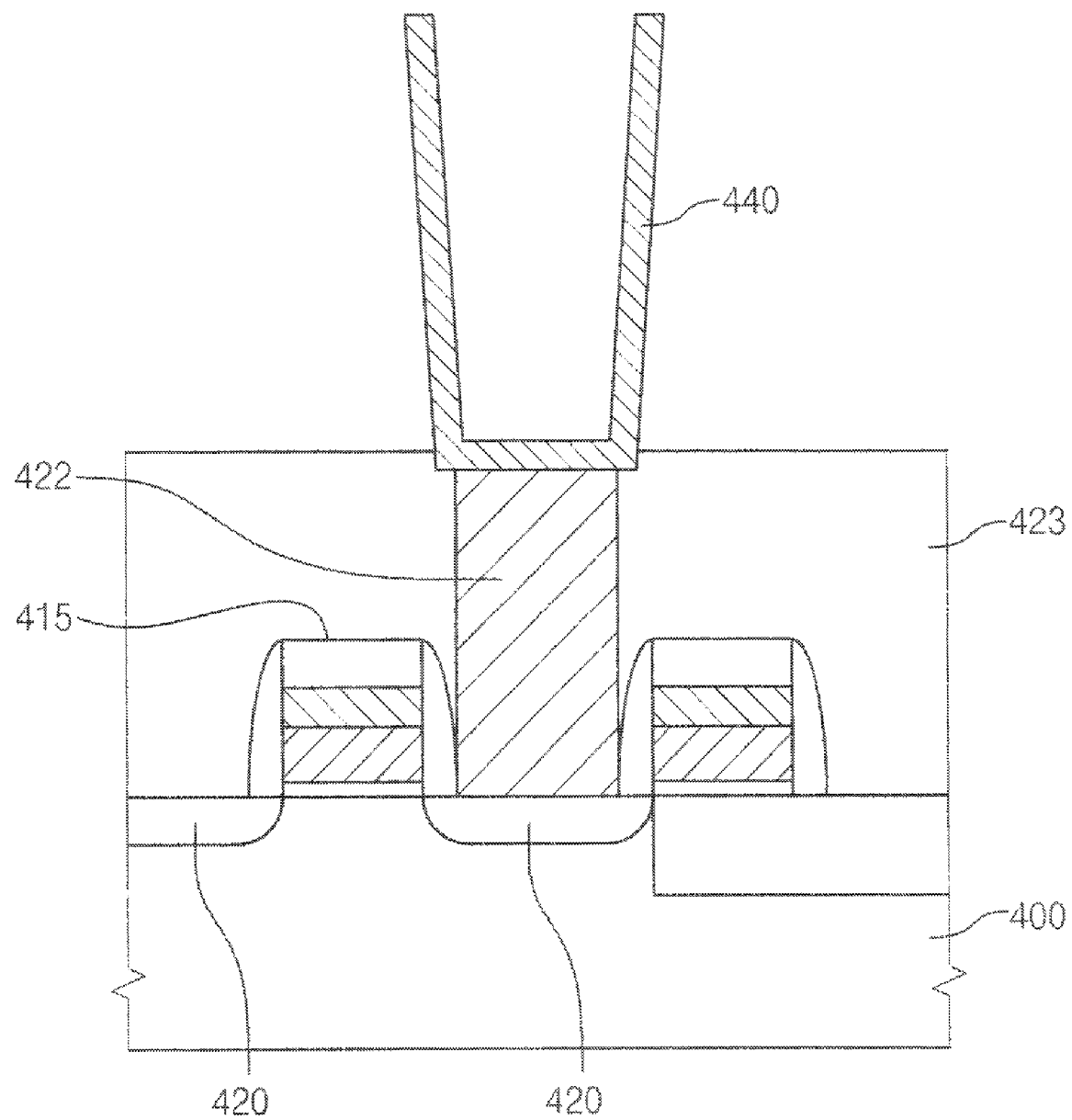

Referring to FIG. 11, a lower electrode 440 electrically connected with the contact plug 422 is formed. A sacrificial layer (not illustrated) is formed on the first conductive layer 426. The sacrificial layer may be formed using an oxide such as silicon oxide. The sacrificial layer and the first conductive layer 424 may be removed until the second insulation layer 422 is exposed.

The sacrificial layer remaining in the contact hole 426 and the second insulation layer pattern 424 may be removed to form the lower electrode 440.

Figure 12:
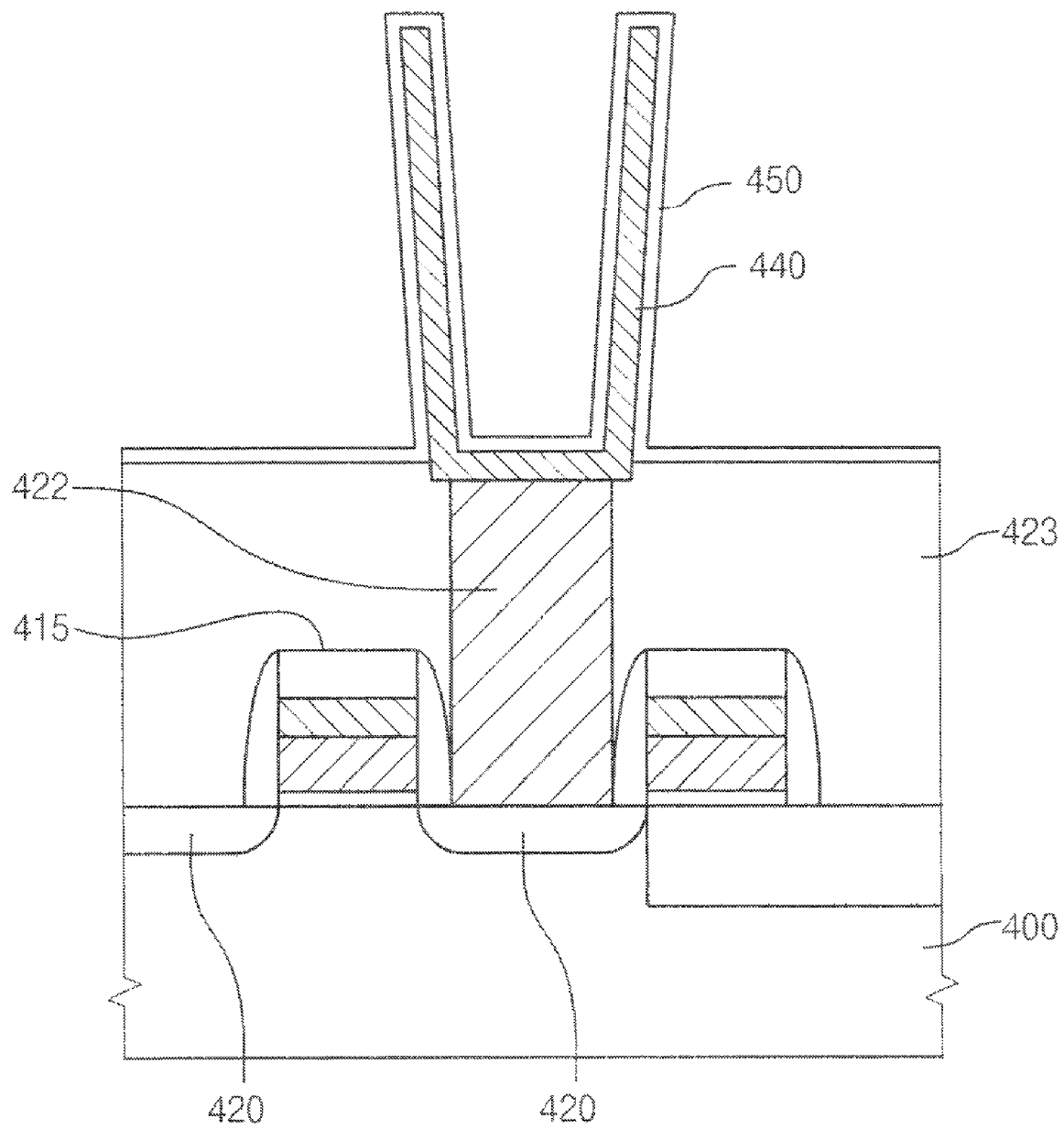

Referring to FIG. 12, a dielectric layer 450 (i.e., a target layer) is formed on the lower electrode 440. The dielectric layer will have a thin equivalent oxidation thickness. Thus, the dielectric layer 450 may be formed using a material having a high dielectric constant. When such a target layer includes a plurality of materials, it may have a substantially higher dielectric constant than a silicon oxide layer and form a far superior dielectric layer 450.

In formation of the dielectric layer 450, a first reaction site (not illustrated) may be formed on a surface of the lower electrode 440. A type and a number of the first reaction site on the lower electrode 440 may be adjusted according to an atmosphere on lower electrode 440 and a treatment with respect to the lower electrode 440. In certain embodiments, the first reaction site may include an oxygen atom when the lower electrode 440 is under an oxygen atmosphere or an ozone atmosphere.

A first precursor, a second precursor and a reactant may be introduced onto the substrate 400 to form the dielectric layer 450 on the lower electrode 440 having a plurality of materials. The first precursor may include a first central atom and a first ligand associated with the first central atom and a second precursor may include a second central atom and a second ligand associated with the second central atom. The reactant may be capable of being reacted with the first and second central atoms to be bonded to the first and second central atoms.

In one embodiment, the first precursor may be chemisorbed on the first reaction site on the lower electrode 440. Then the first central atom or the first ligand may be removed from the first precursor to form a second reaction site. The second precursor is provided to the lower electrode 440 to be chemisorbed onto the second reaction site. The reactant may be introduced to form the dielectric layer 450 on the lower electrode 440.

In another embodiment, the first precursor may be chemisorbed on some of the first reaction sites by insufficiently providing the first precursor to form a second reaction site, on which the first precursor is not chemisorbed. The second precursor may be chemisorbed on the second reaction site by introducing the second precursor into the lower electrode 440. The reactant may be introduced to the lower electrode 440 to form the dielectric layer 450 on the lower electrode 440.

In still another embodiment, a compound including a hydrogen atom may be reacted with the first reaction site on the lower electrode 440 to form a second reaction site having a substantially lower reactivity than the first reaction site. Then, the first precursor may be selectively chemisorbed onto the first reaction site. The second precursor may be chemisorbed on the second reaction site by introducing the second precursor into the lower electrode 440. The reactant may be introduced to the lower electrode 440 to form the dielectric layer 450 on the lower electrode 440.

Figure 13:
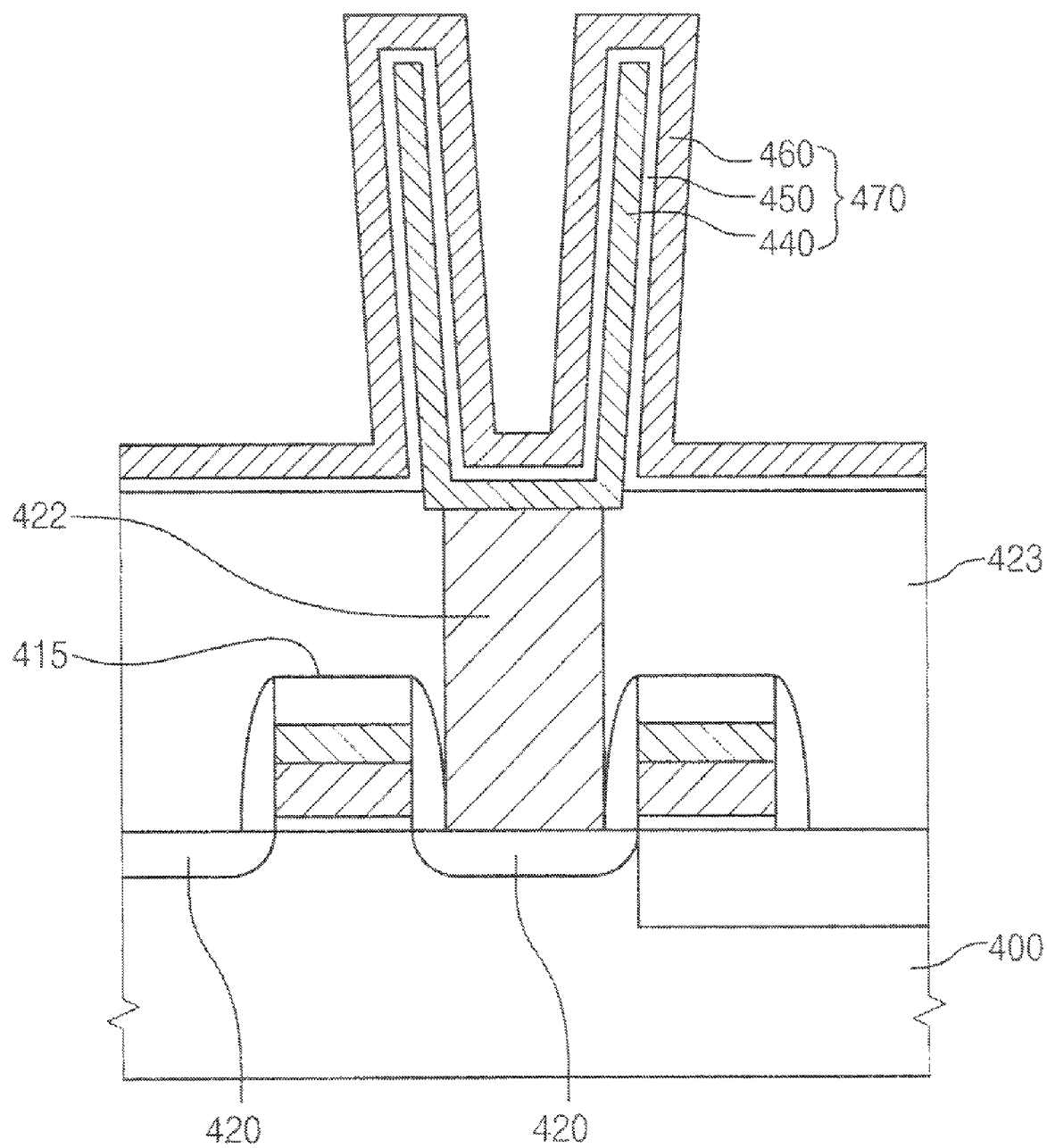

Referring to FIG. 13, an upper electrode 460 is formed on the dielectric layer 450 to form a capacitor 470 including the lower electrode 440, the dielectric layer 450 and the upper electrode 460. The upper electrode 460 may be formed using titanium, titanium nitride, tantalum, tantalum nitride, polysilicon, tungsten, tungsten nitride, ruthenium, etc.

According to the illustrated embodiments, the dielectric layer 450 may include a plurality of materials. A composition ratio of materials included in the dielectric layer 450 may be efficiently adjusted. Thus, when the dielectric layer 450 includes a small quantity of the first central atom or a small quantity of the second central atom, the dielectric layer 450 having a predetermined composition ratio of the materials may be formed. Additionally, a process condition may maintain constant to form the dielectric layer 450 having a uniform composition ratio of materials from a lower portion to an upper portion of the dielectric layer 450.

Hereinafter, a method of manufacturing a semiconductor device in accordance with certain embodiments of the inventive concept will be explained in some detail with reference to the accompanying drawings.

FIGS. 14, 15, 16, 17, and 18 are related cross-sectional views illustrating a method of manufacturing a semiconductor device in accordance with certain embodiments of the inventive concept. Although FIGS. 14 to 18 illustrate methods of manufacturing a non-volatile semiconductor memory device, such as a flash memory device having a floating gate structure, other non-volatile semiconductor devices may be manufactured using the illustrated methods.

Figure 14:
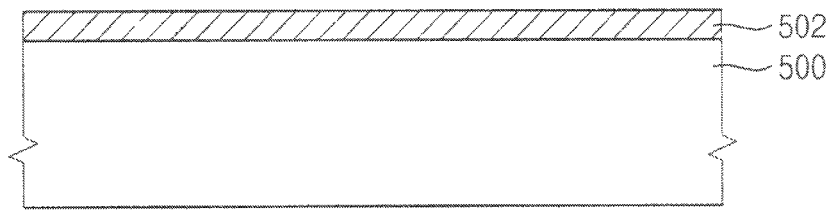
FIGS. 14, 15, 16, 17, and 18 are cross sectional views illustrating a method of manufacturing a semiconductor device in accordance with certain embodiments.

Referring to FIG. 14, an isolation layer (not illustrated) is formed on a substrate 500 including a cell region and a peripheral region to define an active region and a field region on the substrate 500.

The isolation layer may be formed on the substrate 500 using an oxide such as silicon oxide by a thermal oxidation process or a shallow trench isolation (STI) process. The substrate 500 may include a semiconductor substrate such as silicon substrate, a germanium substrate, a silicon-germanium substrate, a silicon-on-insulator substrate, a germanium-on-insulator substrate, etc. Alternatively, the substrate may include a single crystalline metal oxide substrate such as a single crystalline aluminum oxide substrate, a single crystalline strontium titanium oxide substrate, a single crystalline magnesium oxide substrate.

A tunnel insulation layer 502 (i.e., a target layer) is formed on the substrate 500. In embodiments, the tunnel insulation layer 502 may be formed using silicon oxide, silicon oxynitride, etc. by a thermal oxidation process. Alternatively, the tunnel insulation layer 502 may be formed using a plurality of materials.

When the tunnel insulation layer 502 is formed using a plurality of materials, a first reaction site (not illustrated) may be formed on a surface of the substrate 500. A type and a number of the first reaction site on the substrate 500 may be adjusted according to an atmosphere on the substrate 500 and a treatment with respect to the substrate 500. In embodiments, the first reaction site may include an oxygen atom when the substrate 500 is under an oxygen atmosphere or an ozone atmosphere. For example, the first reaction site on the substrate 500 may be an oxygen atom when the substrate 500 is treated with oxygen.

A first precursor, a second precursor and a reactant are introduced onto the substrate 500 to form the tunnel insulation layer 502 on the substrate 500. The first precursor may include a first central atom and a first ligand associated with the first central atom and a second precursor may include a second central atom and a second ligand associated with the second central atom. The reactant may be capable of being reacted with the first and second central atoms to be bonded to the first and second central atoms.

In one embodiment, the first precursor may be chemisorbed on the first reaction site on the substrate 500. Then the first central atom or the first ligand may be removed from the first precursor to form a second reaction site. The second precursor may be provided to the substrate 500 to be chemisorbed onto the second reaction site. The reactant may be introduced to the substrate 500 to form the tunnel insulation layer 502 on the substrate 500.

In another embodiment, the first precursor may be chemisorbed on some of the first reaction sites by insufficiently providing the first precursor into the substrate 500 to form a second reaction site, on which the first precursor is not chemisorbed. The second precursor may be chemisorbed on the second reaction site by introducing the second precursor into the substrate 500. The reactant may be introduced to the substrate 500 to form the tunnel insulation layer 502 on the substrate 500.

In still another embodiment, a compound including a hydrogen atom may be reacted with the first reaction site on the substrate 500 to form a second reaction site having a substantially lower reactivity than the first reaction site with respect to the first precursor. Then, the first precursor may be selectively chemisorbed onto the first reaction site by introducing the first precursor. The second precursor may be chemisorbed on the second reaction site by introducing the second precursor into the substrate 500. The reactant may be introduced to the substrate 500 to form the tunnel insulation layer 502 on the substrate 500.

Figure 15:
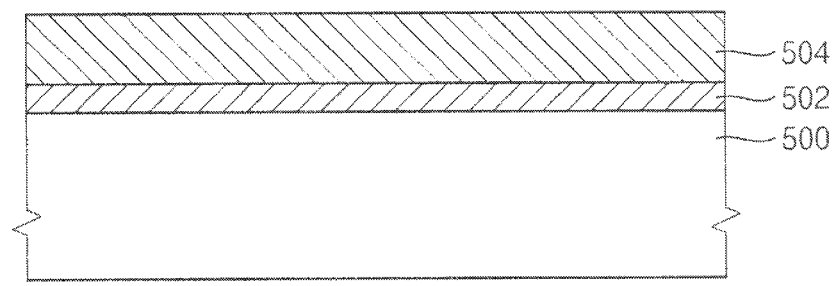

Referring to FIG. 15, a first conductive layer 504 is formed on the tunnel insulation layer 502.

The first conductive layer 504 may be formed using polysilicon, a metal, a metal oxide, etc. In embodiments, the first conductive layer 504 may include titanium, titanium nitride, tantalum, tantalum nitride, polysilicon, tungsten, tungsten nitride, ruthenium, etc. For example, the first conductive layer 504 may be formed using titanium nitride.

The first conductive layer 504 may be partially removed from the isolation layer by a photolithography process to electrically insulate memory cells from one another.

Figure 16:
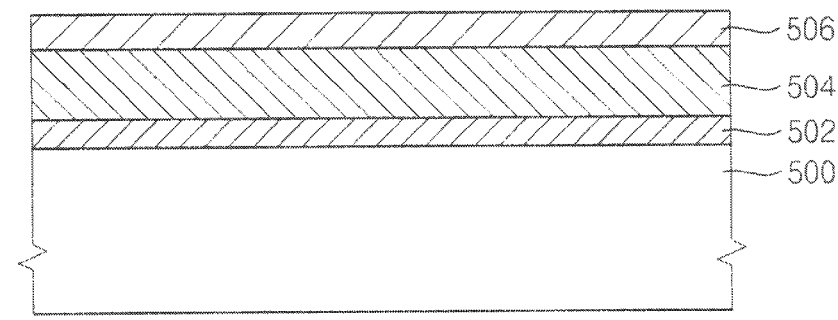

Referring to FIG. 16, a gate insulation layer 506 (i.e., another possible target layer) is formed on the first conductive layer 504. The gate insulation layer 506 may be formed using a plurality of materials. When the gate insulation layer 506 is formed using a plurality of materials, a first reaction site (not illustrated) may be formed on a surface of the first conductive layer 504. A type and a number of the first reaction site on the first conductive layer 504 may be adjusted according to an atmosphere on the first conductive layer 504 and a treatment with respect to the first conductive layer 504. In embodiments, the first reaction site may include an oxygen atom when the first conductive layer 504 is under an oxygen atmosphere or an ozone atmosphere. For example, the first reaction site on the first conductive layer 504 may be an oxygen atom when the first conductive layer 504 is treated with oxygen.

A first precursor, a second precursor and a reactant may be introduced to the first conductive layer 504 to form the gate insulation layer 506 on the first conductive layer 504. The first precursor may include a first central atom and a first ligand associated with the first central atom and a second precursor may include a second central atom and a second ligand associated with the second central atom. The reactant may be capable of being reacted with the first and second central atoms to be bonded to the first and second central atoms.

In one embodiment, the first precursor may be chemisorbed on the first reaction site on the first conductive layer 504. Then the first central atom or the first ligand may be removed from the first precursor to form a second reaction site. The second precursor is provided to the first conductive layer 504 to be chemisorbed onto the second reaction site. The reactant may be introduced to form the gate insulation layer 506 on the first conductive layer 504.

In another embodiment, the first precursor may be chemisorbed on some of the first reaction site by insufficiently providing the first precursor into the first conductive layer 504 to form a second reaction site on which the first precursor is not chemisorbed. The second precursor may be chemisorbed on the second reaction site by introducing the second precursor into the first conductive layer 504. The reactant may be introduced to the first conductive layer 504 to form the gate insulation layer 506 on the first conductive layer 504.

In still another embodiment, a compound including a hydrogen atom may be reacted with the first reaction site on the first conductive layer 504 to form a second reaction site having a substantially lower reactivity than the first reaction site with respect to the first precursor. Then, the first precursor may be selectively chemisorbed onto the first reaction site. The second precursor may be chemisorbed on the second reaction site by introducing the second precursor into the first conductive layer 504. The reactant may be introduced to the first conductive layer 504 to form the gate insulation layer 506 on the first conductive layer 504.

Figure 17:
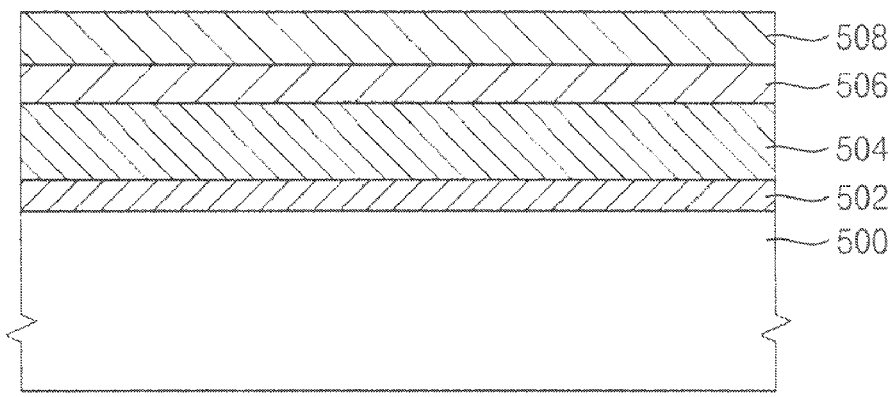

Referring to FIG. 17, a second conductive layer 508 is formed on the gate insulation layer 506. The second conductive layer 508 may be formed using polysilicon by a chemical vapor deposition (CVD) process. In embodiments, the second conductive layer 508 may be formed using a metal silicide such as tungsten silicide, titanium silicide, tantalum silicide, etc.

Figure 18:
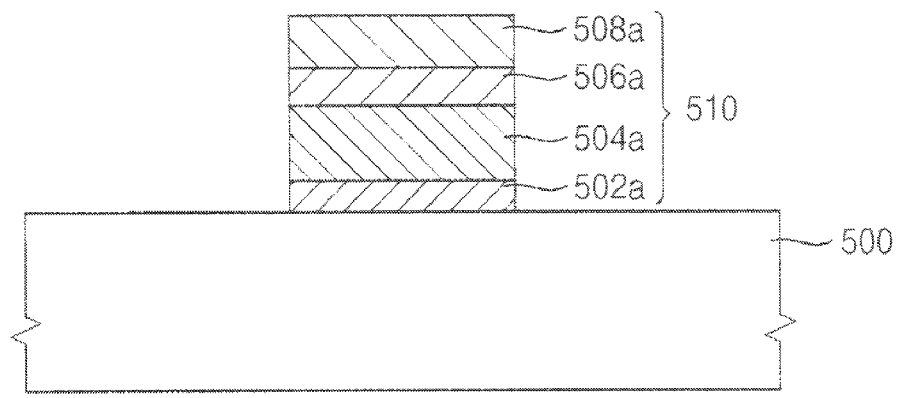

Referring to FIG. 18, the second conductive layer 508, the gate insulation layer 506, the first conductive layer 504 and the tunnel insulation layer 502 are patterned to form a gate structure 510. The gate structure 510 may include a gate electrode 508a, a gate insulation layer pattern 506a, a floating gate 504a and a tunnel insulation layer pattern 502a. The gate structure 510 may be formed by an anisotropic etching process.

Source/drain regions (not illustrated) may be formed on the substrate 500 adjacent to the gate structure 510.

According to the illustrated embodiments, the tunnel insulation layer pattern 502a and/or the gate insulation layer pattern 506a may be formed using a plurality of materials. A composition ratio of materials included in the tunnel insulation layer pattern 502a and the gate insulation layer pattern 506a may be efficiently adjusted. Thus, when the tunnel insulation layer pattern 502a and the gate insulation layer pattern 506a includes a small quantity of the first central atom or a small quantity of the second central atom, the tunnel insulation layer pattern 502a and the gate insulation layer pattern 506a having a predetermined composition ratio of the materials may be efficiently formed. Additionally, a process condition may maintain constant to form the tunnel insulation layer pattern 502a and/or the gate insulation layer pattern 506a having the uniform composition ratio of materials from a lower portion to an upper portion of the tunnel insulation layer pattern 502a and the gate insulation layer pattern 506a.

According to embodiments, in formation of a layer including a plurality of materials, a composition ratio of materials included in the layer may be efficiently adjusted. Thus, when the layer is a small quantity of the materials, the composition ratio may be correctly controlled in the layer. Additionally, a process condition may maintain constant for a formation of the layer so that the layer may have the uniform composition ratio of the materials from a lower portion of the layer to an upper portion of the layer. Accordingly, reliability and electrical characteristics of a semiconductor device including the layer may be improved.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of forming a target layer comprising:
   chemisorbing a first precursor including a first central atom and a ligand associated with the first central atom on a first reaction site of an object;
   removing at least one of the first central atom and the ligand in the chemisorbed first precursor to form a second reaction site; and
   chemisorbing a second precursor including a second central atom on the second reaction site.

2. The method of claim 1, wherein forming the second reaction site comprises performing a heat treatment on the object at a temperature ranging between about 200 to 400° C.

3. The method of claim 1, wherein forming the second reaction site comprises performing a plasma treatment on the object using a plasma generated from an inactive gas.

4. The method of claim 1, further comprising:
   introducing a compound including an oxygen atom or a nitrogen atom to be reacted with at least one of the first precursor and the second precursor.

5. The method of claim 1, wherein the first reaction site is an oxygen atom.

6. The method of claim 5, wherein the first reaction site is formed by treating the object with a compound including an oxygen atom.

7. The method of claim 1, wherein the second reaction site is the same as the first reaction site.

8. The method of claim 1, wherein the second reaction site includes the first central atom.

9. The method of claim 1, wherein the first central atom is different from the second central atom.

10. The method of claim 9, wherein the first central atom and the second central atom are one selected from a group consisting of; zirconium, hafnium, strontium, silicon and titanium.

11. A method of forming a target layer comprising:
    chemisorbing a first precursor including a first central atom on a first portion of a reaction site of an object; and
    chemisorbing a second precursor on a second portion of the reaction site of the object, the second portion of the reaction site being different from the first portion of the reaction site,
    wherein the reaction site is an oxygen atom.

12. The method of claim 11, wherein chemisorbing the first precursor on the first portion of the reaction site comprises introducing the first precursor at a flow rate of between about 50 to 1,000 sccm for about 3 to 30 seconds.

13. A method of forming a target layer comprising:
    partially transforming a first reaction site into a second reaction site;
    chemisorbing a first precursor including a first central atom on the first reaction site; and
    chemisorbing a second precursor on the second reaction site.

14. The method of claim 13, wherein partially transforming the first reaction site into the second reaction site comprises introducing a compound including a hydrogen atom to be reacted with the first reaction site.

15. The method of claim 14, wherein the compound including the hydrogen atom comprises at least one selected from a group consisting of; hydrogen, ammonia, and deionized water.

16. The method of claim 14, wherein the compound including the hydrogen atom is introduced to the object at a flow rate of between about 50 to 1,000 sccm for about 3 to 30 seconds.

17. The method of claim 14, wherein the first precursor is introduced to the object at a flow rate less than about 1,000 sccm for less than about 30 seconds.

18. The method of claim 13, wherein the first reaction site have a higher reactivity with respect to the first precursor than the second reaction site.

19. The method of claim 13, wherein the first central atom is either silicon or titanium.

* * * * *